United States Patent
Sweeney, II et al.

(10) Patent No.: US 12,167,569 B2
(45) Date of Patent: Dec. 10, 2024

(54) MOBILE HIGH PERFORMANCE COMPUTING PLATFORM FOR CRYPTOCURRENCY MINING

(71) Applicant: DaVinci 3.0 Incorporated, Bedford, MA (US)

(72) Inventors: Patrick J. Sweeney, II, Bedford, MA (US); John DeCarlo, Bedford, MA (US); Paul Nickelsberg, Bedford, MA (US); Ajeet Yadav, Bedford, MA (US); Garet Holcomb, Bedford, MA (US)

(73) Assignee: DaVinci 3.0 Incorporated, Bedford, MA (US)

( * ) Notice: Subject to any disclaimer, the term of this patent is extended or adjusted under 35 U.S.C. 154(b) by 0 days.

(21) Appl. No.: 18/095,921

(22) Filed: Jan. 11, 2023

(65) Prior Publication Data
US 2023/0225077 A1     Jul. 13, 2023

Related U.S. Application Data

(60) Provisional application No. 63/312,603, filed on Feb. 22, 2022, provisional application No. 63/298,373, filed on Jan. 11, 2022.

(51) Int. Cl.
*H05K 7/20* (2006.01)
*G06F 1/20* (2006.01)

(52) U.S. Cl.
CPC ......... *H05K 7/20236* (2013.01); *G06F 1/206* (2013.01); *H05K 7/20136* (2013.01);
(Continued)

(58) Field of Classification Search
CPC ........... H05K 7/20136; H05K 7/20236; H05K 7/20263; H05K 7/20272; H05K 7/20836; G06F 1/206
See application file for complete search history.

(56) References Cited

U.S. PATENT DOCUMENTS

| | | | |
|---|---|---|---|
| 7,983,040 B2 * | 7/2011 | Campbell | H05K 7/20236 174/15.1 |
| 8,184,436 B2 * | 5/2012 | Campbell | H05K 7/203 361/701 |

(Continued)

FOREIGN PATENT DOCUMENTS

RU     2643173 C1 *  1/2018 ............... G06F 1/20

OTHER PUBLICATIONS

International Search Report and Written Opinion issued to related International Application No. PCT/US23/10620, dated May 3, 2023, 23 pages.

(Continued)

*Primary Examiner* — Robert J Hoffberg
(74) *Attorney, Agent, or Firm* — K&L Gates LLP

(57) ABSTRACT

A self-contained mobile high performance computing platform for cryptocurrency mining is disclosed. The self-contained mobile high performance computing platform includes a mobile cabinet, which includes wheels for easy movement and placement within, for example, a warehouse facility, a garage, a basement, an office tower, or a vehicle such as a truck or van. The cabinet is configured to enclose at least one computing apparatus, which includes computing blades immersed in an oil or other dielectric fluid for immersion cooling. The computing blades are configured to be connected to respective interface boards via connectors that are located within a tank of the dielectric fluid. Each computing blade may be individually removed or replaced, thereby enabling an inoperable or low performance computing blade to be disconnected without affecting the operations of the other computing blades.

22 Claims, 24 Drawing Sheets

(52) U.S. Cl.
CPC ..... *H05K 7/20263* (2013.01); *H05K 7/20272* (2013.01); *H05K 7/20781* (2013.01); *H05K 7/20836* (2013.01)

(56) References Cited

U.S. PATENT DOCUMENTS

| | | | | |
|---|---|---|---|---|
| 8,351,206 | B2* | 1/2013 | Campbell | H05K 7/20809 |
| | | | | 361/691 |
| 9,195,282 | B2* | 11/2015 | Shelnutt | H05K 7/20827 |
| 9,992,914 | B2* | 6/2018 | Best | G06F 1/20 |
| 10,257,963 | B2* | 4/2019 | Ozyalcin | H05K 7/20236 |
| 10,405,457 | B2* | 9/2019 | Boyd | H05K 7/20236 |
| 10,820,446 | B2* | 10/2020 | Boyd | H05K 7/20272 |
| 11,006,547 | B2* | 5/2021 | Gao | G06F 1/20 |
| 11,101,630 | B1* | 8/2021 | Lau | H05K 7/1492 |
| 11,153,989 | B2* | 10/2021 | Onodera | H05K 7/20236 |
| 11,696,423 | B2* | 7/2023 | Sweeney | H05K 7/20236 |
| | | | | 361/679.53 |
| 11,889,658 | B2* | 1/2024 | Gao | H05K 7/20781 |
| 2007/0268669 | A1 | 11/2007 | Attlesey | |
| 2011/0075353 | A1 | 3/2011 | Attlesey | |
| 2011/0315353 | A1 | 12/2011 | Campbell et al. | |
| 2020/0383236 | A1* | 12/2020 | Edmunds | H01R 13/5219 |
| 2022/0104393 | A1* | 3/2022 | Boyd | H05K 7/20781 |
| 2022/0104394 | A1* | 3/2022 | Boyd | H05K 7/20272 |
| 2023/0042343 | A1* | 2/2023 | Hashimoto | H05K 7/20272 |
| 2024/0064931 | A1* | 2/2024 | Chuang | H05K 7/20763 |
| 2024/0090169 | A1* | 3/2024 | Bean, Jr. | H05K 7/20263 |

OTHER PUBLICATIONS

Space Design Warehouse. "Immersion Coolling RTX 3080 ETH Mining Rig with Dielectric Coolant" Video [online]. Nov. 7, 2021; Youtube; Video [online]. Nov. 7, 2021 [retrieved Mar. 23, 2023]. Retrieved from the internet: <URL:https://www.youtube.com/watch?v=rCOcPEXtQ_4>.

International Preliminary Report on Patentability issued to PCT/US2023/010620, dated Mar. 19, 2024, 20 pages.

* cited by examiner

MOBILE HIGH PERFORMANCE COMPUTING PLATFORM FOR CRYPTOCURRENCY MINING

PRIORITY CLAIM

This application claims priority to and the benefit as a non-provisional application of U.S. Provisional Patent Application No. 63/298,373, filed Jan. 11, 2022, and U.S. Provisional Patent Application No. 63/312,603, filed Feb. 22, 2022, the entire contents of which are hereby incorporated by reference and relied upon.

BACKGROUND

Cryptocurrencies are prevalent in society. Currently, there are close to nine thousand different cryptocurrencies worth an estimated one trillion dollars. While most cryptocurrencies have an initial public offering where some coins can be purchased, many cryptocurrencies are programmed to enable mining for additional coins. Mining often entails computationally operating a complex algorithm to solve an equation or determine a serial number or other identifier of a coin. A known problem with cryptocurrency mining is that it is extremely power intensive where tens to hundreds of processors operating together are needed to adequately find coins.

Currently, cryptocurrency miners construct large networks of off-the-shelf computers to mine coins. The computers are often placed together in a cooled room such that each mining site is unique. This means that miners not only have to set up computers to mine for coins, the miners also often have to be (or employ) computer network architects. This accordingly adds to the mining overhead. Additionally, the computers are often networked in haphazard configurations that creates computational inefficiencies. Part of the cause of these challenges is that there are no standard sized mining machines, or even mining racks. By contrast, the mature data center industry long ago standardized rack units with nineteen-inch racks having a vertical spacing of 1.75 inches. Crypto mining has no such consistency. Additionally, in many instances, the physical layout of the computers makes it difficult to service or replace a single faulty computer without disrupting the entire mining process.

A need accordingly exists for a mobile high performance computing platform for cryptocurrency mining.

SUMMARY

A self-contained mobile high performance computing platform is disclosed herein. The self-contained mobile high performance computing platform includes at least one computing apparatus that is enclosed within a mobile cabinet. The computing apparatus includes a plurality of computing blades that are configured for mining cryptocurrency coins. The computing blades are immersed within a tank of oil or dielectric fluid to keep the blades operating at an optimal temperature and prevent overheating. Each tank may accommodate at least ten computing blades and as many as forty computing blades. The dielectric fluid is cycled through the tank to enable one or more fluid heat exchangers to maintain a specified temperature. The fluid heat exchangers are also fluidly coupled to a closed loop for a cooling fluid, which removes heat from the dielectric fluid. A source of the cooling fluid is coupled to an air heat exchanger or a cooling tower to enable air to remove heat from the cooling fluid that has returned from the fluid heat exchangers.

The computing apparatus is self-contained, which enables the mobile high performance computing platform to be deployed virtually anywhere without needing extensive setup. In some embodiments the mobile cabinet includes two, four, six, eight, etc. mobile computing apparatuses. The compartmental nature of each computing apparatus enables the mobile cabinet to be scaled based on mining needs.

Each mobile cabinet includes a control processor that is communicatively coupled to each of the blades through interface boards. The control processor is configured to manage the mining processes among the computing blades. The control processor is also configured to use temperature data from a sensor immersed within each of the tanks or provided by each of the computing blades to control dielectric fluid pumps and cooling fluid pumps for maintaining a specified temperature of the dielectric fluid. The control processor may be communicatively coupled to a remote computing system for reporting performance of each computing blade and/or to provide alerts regarding inoperable or problematic blades. The sensors within the tank also form the basis for a self-adjusting control processor that can either optimize energy usage or optimize performance. The mobile cabinet provides access to each of the computing blades to enable its removal from the tank without having to suspend the mining operations in the other blades.

In some embodiments, the mobile high performance computing platform may be pre-certified to conform to one or more building and/or electrical codes. The pre-certification enables the mobile high performance computing platform to be installed as a large appliance without significant (or any) inspection or construction requirements. The pre-certification and portability of the high performance computing platform enables it to be periodically moved based on energy usage rates, energy availability, or other factors.

Aspects of the subject matter described herein may be useful alone or in combination with one or more other aspect described herein. Without limiting the foregoing description, in a first aspect of the present disclosure, a mobile computing apparatus includes a tank configured to hold a dielectric fluid where the tank includes an inlet port to receive the dielectric fluid and an outlet port from which the dielectric fluid is pulled and a plurality of connectors located within the tank. Each connector is configured to receive a computing blade that is immersed within the dielectric fluid and configured for mining cryptocurrency coins. Each connector is electrically and communicatively coupled to an interface board that is located outside of the tank. The mobile computing apparatus also includes at least one heat exchanger configured to cool the dielectric fluid, a from-tank line having a first end connected to the outlet port of the tank and a second end connected to a first input end of the at least one heat exchanger, and a dielectric fluid pump fluidly coupled to a first outlet end of the at least one heat exchanger. The dielectric fluid pump is configured to pump the dielectric fluid from the at least one heat exchanger to the tank via a to-tank line. The mobile computing apparatus further includes a source of cooling fluid, a from-source ling having a first end connected to the source of the cooling fluid and a second end connected to a second input end of the at least one heat exchanger, and a cooling fluid pump fluidly coupled a second end of the at least one heat exchanger. The cooling fluid pump is configured to pump the cooling fluid from the at least one heat exchanger to the source for cooling fluid via a to-source line.

In a second aspect of the present disclosure, which may be combined with the first aspect in combination with any other aspect listed herein unless specified otherwise, the at least one heat exchanger includes two heat exchangers and the second end of the from-tank line branches to each of the first input ends of the two heat exchangers. Additionally, the first outlet end of each of the heat exchangers is fluidly coupled to a single input line that is fluidly connected to the dielectric fluid pump.

In a third aspect of the present disclosure, which may be combined with the second aspect in combination with any other aspect listed herein unless specified otherwise, the second end of the from-source line branches to each of the second input ends of the two heat exchangers and the second outlet end of each of the heat exchangers is fluidly coupled to a single input line that is fluidly connected to the cooling fluid pump.

In a fourth aspect of the present disclosure, which may be combined with the first aspect in combination with any other aspect listed herein unless specified otherwise, the apparatus further comprises a manifold fluidly coupled between the inlet port and an interior of the tank, the manifold including a plurality of openings through which the dielectric fluid is pushed toward the outlet port.

In a fifth aspect of the present disclosure, which may be combined with the fourth aspect in combination with any other aspect listed herein unless specified otherwise, the plurality of openings of the manifold include circular apertures or parallel slots.

In a sixth aspect of the present disclosure, which may be combined with the fifth aspect in combination with any other aspect listed herein unless specified otherwise, the circular apertures have varying diameters between 0.1 millimeters and 2 centimeters.

In a seventh aspect of the present disclosure, which may be combined with the fourth aspect in combination with any other aspect listed herein unless specified otherwise, the manifold is located on a side of the tank, and the outlet port includes a plurality of outlet ports that are located on an opposite side of the tank across from the manifold.

In an eighth aspect of the present disclosure, which may be combined with the fourth aspect in combination with any other aspect listed herein unless specified otherwise, the manifold is located on a bottom of the tank, and the outlet port includes a plurality of outlet ports that are located on a top of the tank across from the manifold.

In a ninth aspect of the present disclosure, which may be combined with the first aspect in combination with any other aspect listed herein unless specified otherwise, each connector is located at a bottom of the tank or along a side of the tank.

In a tenth aspect of the present disclosure, which may be combined with the first aspect in combination with any other aspect listed herein unless specified otherwise, each interface board includes power circuitry configured to convert an AC voltage into one or more DC voltages for the respective computing blade and communication circuitry for communicatively coupling the respective computing blade to a control processor.

In an eleventh aspect of the present disclosure, which may be combined with the first aspect in combination with any other aspect listed herein unless specified otherwise, the apparatus further includes a plurality of interface board housings, each interface board housing configured to enclose at least one interface board and located adjacent to the tank. For each interface board housing, there is at least one bracket having a first end connected to the respective interface board housing and a second end connected to one of the computing blades to retain in place the computing blade.

In a twelfth aspect of the present disclosure, which may be combined with the first aspect in combination with any other aspect listed herein unless specified otherwise, the source of fluid includes a cooling fluid tower.

In a thirteenth aspect of the present disclosure, which may be combined with the first aspect in combination with any other aspect listed herein unless specified otherwise, the apparatus further comprises an air heat exchanger aligned with the source of cooling fluid and at least one blower configured to flow air across the air heat exchanger.

In a fourteenth aspect of the present disclosure, which may be combined with the first aspect in combination with any other aspect listed herein unless specified otherwise, the apparatus further comprises at least one temperature sensor configured to be immersed within the dielectric fluid within the tank and a control processor communicatively coupled to the at least one temperature sensor, the dielectric fluid pump, and the cooling fluid pump. The control processor is configured to receive temperature data from the at least one temperature sensor and control a pumping speed of at least one of the dielectric fluid pump or the cooling fluid pump to maintain a specified dielectric fluid temperature.

In a fifteenth aspect of the present disclosure, which may be combined with the fourteenth aspect in combination with any other aspect listed herein unless specified otherwise, the at least one temperature sensor is coupled to the tank.

In a sixteenth aspect of the present disclosure, which may be combined with the fourteenth aspect in combination with any other aspect listed herein unless specified otherwise, the at least one temperature sensor is located on at least one of the computing blades.

In a seventeenth aspect of the present disclosure, which may be combined with the fourteenth aspect in combination with any other aspect listed herein unless specified otherwise, the specified dielectric fluid temperature is a first specified dielectric fluid temperature that corresponds to a temperature selected to conserve energy or a second specified dielectric fluid temperature that corresponds to a temperature selected to maximize computing power of the computing blades.

In an eighteenth aspect of the present disclosure, which may be combined with the seventeenth aspect in combination with any other aspect listed herein unless specified otherwise, the control processor is configured to receive a selection of the first or second specified dielectric fluid temperature or select the first or second specified dielectric fluid temperature based on detected computing operations of the computing blades.

In a nineteenth aspect of the present disclosure, a mobile computing system includes a cabinet comprising at least one air intake located along a rear panel, an air exhaust located along a top panel, and at least one door located along a front panel. The mobile computing system also includes at least one mobile computing apparatus located within the cabinet. The at least one mobile computing apparatus includes a tank configured to hold a dielectric fluid, the tank including an inlet port to receive the dielectric fluid and an outlet port from which the dielectric fluid is pulled. The mobile computing apparatus also includes a plurality of connectors located within the tank. Each connector is configured to receive a computing blade that is immersed within the dielectric fluid and configured for mining cryptocurrency coins. Each connector is electrically and communicatively coupled to an interface board that is located outside of the tank. The mobile computing apparatus further includes at least one heat exchanger configured to cool the dielectric fluid, a from-tank line having a first end connected to the outlet port of the tank and a second end connected to a first input end of the at least one heat exchanger, and a dielectric fluid pump fluidly coupled to a first outlet end of the at least one heat exchanger. The dielectric fluid pump is configured to pump the dielectric fluid from the at least one heat exchanger to the tank via a to-tank line. The mobile computing apparatus moreover includes a source of cooling fluid, a from-source line having a first end connected to the source of the cooling fluid and a second end connected to a second input end of the at least one heat exchanger, and a cooling fluid pump fluidly coupled to a second outlet end of the at least one heat exchanger. The cooling fluid pump is configured to pump the cooling fluid from the at least one heat exchanger to the source for cooling fluid via a to-source line.

In a twentieth aspect of the present disclosure, which may be combined with the nineteenth aspect in combination with any other aspect listed herein unless specified otherwise, the cabinet is configured to enclose four mobile computing apparatuses, two of the mobile computing apparatuses located on a top shelf and two mobile computing apparatuses located on a bottom shelf.

In a twenty-first aspect of the present disclosure, which may be combined with the nineteenth aspect in combination with any other aspect listed herein unless specified otherwise, the cabinet includes a top air intake aligned with the top shelf and a bottom air intake aligned with the bottom shelf.

In a twenty-second aspect of the present disclosure, which may be combined with the nineteenth aspect in combination with any other aspect listed herein unless specified otherwise, each mobile computing apparatus includes at least one temperature sensor configured to be immersed within the dielectric fluid within the respective tank, and a control processor communicatively coupled to the at least one temperature sensor, the dielectric fluid pump, and the cooling fluid pump. The control processor is configured to receive temperature data from the at least one temperature sensor and control a pumping speed of at least one of the dielectric fluid pump or the cooling fluid pump to maintain a specified dielectric fluid temperature.

In a twenty-third aspect of the present disclosure, which may be combined with the nineteenth aspect in combination with any other aspect listed herein unless specified otherwise, the system further comprises a control processor communicatively coupled to each of the mobile computing apparatuses for control of a pumping speed of at least one of the dielectric fluid pump or the cooling fluid pump of each mobile computing apparatus to maintain a specified dielectric fluid temperature.

In light of the present disclosure and the above aspects, it is therefore an advantage of the present disclosure to provide a mobile high performance computing platform or system that can be easily deployed at virtually any location.

It is another advantage of the present disclosure to provide a scalable mobile high performance computing platform or system.

It is a further advantage of the present disclosure to provide a mobile high performance computing platform or system that enables individual computing blades to be swapped without affecting a cryptocurrency mining operation or any other computing process.

Additional features and advantages are described in, and will be apparent from, the following Detailed Description and the Figures. The features and advantages described herein are not all-inclusive and, in particular, many additional features and advantages will be apparent to one of ordinary skill in the art in view of the figures and description. Also, any particular embodiment does not need to have all of the advantages listed herein and it is expressly contemplated to claim individual advantageous embodiments separately. Moreover, it should be noted that the language used in the specification has been selected principally for readability and instructional purposes, and not to limit the scope of the inventive subject matter.

DETAILED DESCRIPTION

A self-contained mobile high performance computing platform is disclosed herein. The mobile high performance computing platform includes a mobile cabinet, which includes wheels for easy movement and placement within, for example, a warehouse facility, a garage, a basement, an office tower, or a vehicle such as a truck or van. The cabinet is configured to enclose at least one computing apparatus, which includes computing blades immersed in an oil or other dielectric fluid for immersion cooling. In some embodiments, the cabinet is scalable and can accommodate up to four or more computing apparatuses and corresponding immersion tanks. Each computing apparatus may be individually removed from the cabinet as needed without disrupting the operation of the other computing apparatuses.

The computing blades for each computing apparatus are configured to be connected to respective interface boards via connectors that are located within a tank of the dielectric fluid, thereby eliminating extensive cabling. Each computing blade may be individually removed or replaced, thereby enabling an inoperable or low performance computing blade to be disconnected without affecting the operations of the other computing blades. Each interface board may include power circuitry for converting an AC voltage into one or more DC voltages for the respective computing blade. Each interface board may also include one or more communication interfaces for communicatively coupling the respective computing blade with a control processor, which may be located within the cabinet or remote from the cabinet.

Each of the computing apparatuses is configured to provide self-contained cooling of the dielectric fluid. To provide cooling, the dielectric fluid is cycled through a closed loop that includes at least one fluid heat exchanger and a pump. The at least one fluid heat exchanger is also part of a closed fluid loop for a cooling fluid, such as water. The water is moved by a pump between the at least one fluid heat exchanger and an air heat exchanger, a cooling tower, or other cold water source to remove heat from the computing apparatus. The control processor may be communicatively coupled to the fluid pumps and use a temperature measurement of the dielectric fluid with the tank to determine pump speeds and/or fluid flow rates.

Reference is made herein to using the computing apparatus for mining cryptocurrency coins. It should be appreciated that the computing apparatus of the high performance computing platform can be configured for virtually any computing application that requires the use of numerous computing blades. For instance, the computing blades may be configured for video rendering, video streaming, machine learning, artificial intelligence, cyber security, etc.

Example Mobile High Performance Computing Platform

Figure 1:
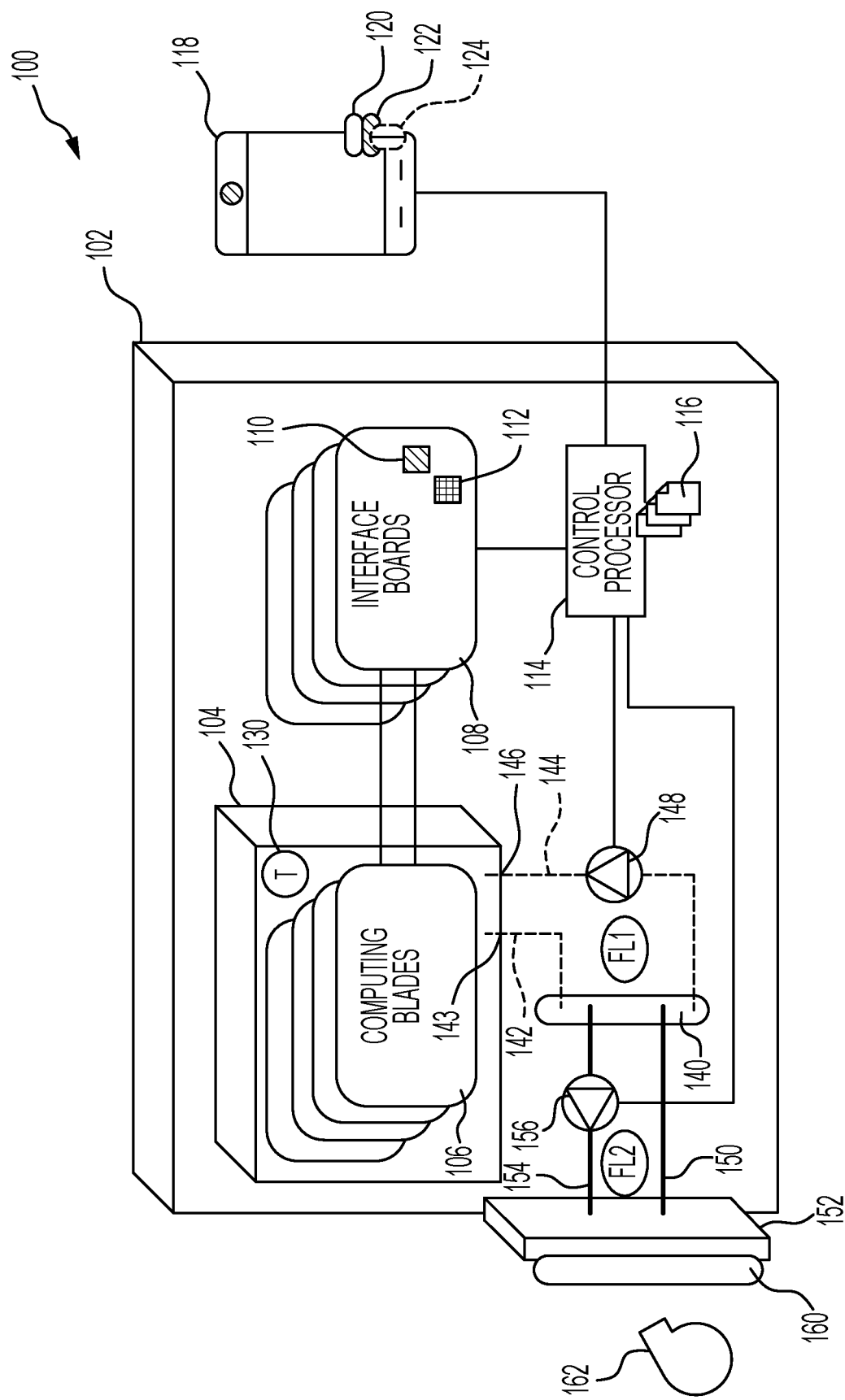
FIG. 1 is a diagram of a self-contained mobile high performance computing platform that includes at least one computing apparatus, according to an example embodiment of the present disclosure.

FIG. 1 is a diagram of a mobile high performance computing platform 100 (e.g., a system) that includes at least one computing apparatus 102, according to an example embodiment of the present disclosure. The computing apparatus 102 includes an immersion tank 104 that is configured to retain or hold oil or another dielectric fluid. Computing blades 106 are configured to be immersed into the immersion tank 104. Each tank 104 is configured to retain between ten to forty computing blades 106. Each computing blade 106 includes one or more application specific integrated circuits ("ASICs"), microcontrollers, processors, etc. that are configured to perform complex computing operations, such as mining for cryptocurrency coins. Immersion of the computing blades 106 within the tank 104 enables the dialectic fluid to flow across the computing blades 106, thereby cooling the computing blades 106. The use of a liquid, such as dielectric fluid, provides better heat transfer compared to air, is significantly quieter as a system, and allows the computing blades 106 to be positioned relatively close together for a compact, mobile arrangement.

As shown in FIG. 1, each computing blade 106 is electrically and communicatively coupled to an interface board 108. In other embodiments, one interface board 108 may be electrically and communicatively coupled to multiple computing blades 106. Each interface board 108 includes power circuitry 110 and communication circuity 112. The power circuitry 110 is configured to rectify and otherwise generate one or more DC voltages for the ASICs microcontrollers, processors, etc. In some instances, the interface boards 108 are configured to receive an AC voltage from a power source, such as a main power source or a generator. In these instances, the power circuitry 110 includes bridge rectifiers, filters, switches, drivers, voltage regulators, etc. to generate one or more DC voltages. In other instances, the interface boards 108 are configured to receive a DC voltage from a power source. In these instances, the power circuitry 110 includes filters, switches, drivers, voltage regulators, etc. to step down the DC voltage to one or more lower DC voltages.

The communication circuitry 112 is configured to enable the respective computing blade 106 to communicate with a control processor 114. The communication may use an Ethernet protocol, a serial protocol such as RS232, a controller area network ("CAN") protocol, a fiber-optic protocol, a local area network ("LAN") protocol, etc. The control processor 114 is configured to communicate with each of the computing blades 106 to coordinate, for example, a cryptocurrency mining process (e.g., methods for verifying transactions and creating new coins including Proof of Work ("PoW") transactions and Proof of Stake ("PoS") transactions). For instance, the control processor 114 may transmit instructions to each of the computing blades 106 regarding specific functions that are to be executed. Each computing blade provides an answer or mining reward in response, which is transmitted to the control processor 114. After receiving the response, the control processor 114 then determines another function to execute.

The control processor 114 also receives diagnostic information from each computing blade 106, such as temperature and/or performance information. The control processor 114 is configured to execute one or more instructions (e.g., firmware) 116 that specify operations described herein. The firmware 116 may be configured to operate the Stratum V2 protocol for cryptocurrency mining, for example. The single control processor 114 is configured to communicate with each of the interface boards 108 of the computing apparatus 102, thereby enabling computing blade 106 scalability. In alternative embodiments, the control processor 114 may be located within a cabinet and coupled to multiple computing apparatuses 102.

In some embodiments, the control processor 114 is configured to monitor the temperature of the dielectric fluid within the tank 104. When the temperature reaches a specified threshold, the control processor 114 may change a pumping speed of a pump (discussed below) to increase a rate at which the dielectric fluid is cooled and/or a computing speed at which the ASIC chips of the computing blades 106 are being operated, which is often referred to as hashing power. The design of the firmware 116 enables computing blades 106 and/or computing apparatuses 102 to be removed without affecting the operations of the other computing blades 106 and/or computing apparatuses 102.

As shown in FIG. 1, in some embodiments, the control processor 114 is communicatively coupled to a client device 118, such as a tablet computer, a smartphone, a laptop computer, a workstation, a server, etc. The control processor 114 may communicate via a Wi-Fi protocol, an Ethernet protocol, a cellular protocol, a wireless LAN protocol, etc. The client device 118 includes a processor 120 and a memory device 122 storing instructions that define an application 124. Execution of the instructions enables the processor 120 to perform the operations described herein.

In some embodiments, the application 124 may display one or more user interfaces, such as a dashboard, that graphically shows a health of the computing apparatus 102. For example, the control processor 114 may be configured to transmit temperature and/or performance data to the application 124. Accordingly, a dashboard may show a temperature of each computing blade 106 and/or a temperature of the tank 104. In some instances, the dashboard may display an alarm or an alert when a tank temperature (or computing blade 106) exceeds a threshold, such as 65° C. or 75° C. Additionally or alternatively, the dashboard may show a computing performance (e.g., computations per second) of each computing blade 106 and/or an indication that a computing blade 106 is inoperable and should be replaced. The dashboard may also display a pumping speed of the fluid pumps.

In some embodiments, the application 124 is configured to collect mining rewards from the control processor 114, which may be stored in a virtual wallet or cryptocurrency account. The application 124 may also be configured to provide mining direction or challenges to the control processor 114, which is configured to distribute the direction or challenges among the computing blades 106. The control processor 114 may further monitor performance and/or processing response time of the computing blades 106.

In some instances, the application 124 enables a user to set an operation goal, such as 'efficiency' or 'performance'. Selection of a goal is transmitted to the control processor 114, which provides commands to the computing blades 106. The control processor 114 is also configured to adjust a pumping speed based on a selected goal. For instance, selection of the 'performance' goal may cause the control processor 114 to instruct the computing blades 106 to perform at a maximum performance or computation rate. The control processor 114 also increases a pumping speed of the fluid pumps to handle the expected increase in heat generation from the computing blades. Such a configuration may keep the dielectric fluid between, for example, 25° C. and 60° C. despite the generation of additional heat. In another example, selection of the 'efficiency' goal causes the control processor 114 to set a performance of the computing blades 106 and a pumping speed of the fluid pumps to maximize energy efficiency while still performing mining operations.

In some embodiments, the control processor 114 is configured to monitor and rank a performance of the computing blades 106. The control processor 114 may use machine learning defined by the firmware 116, for example. The control processor 114 may aggregate performance, efficiency, and/or temperature data for each computing blade 106. The control processor 114 may more heavily use the computing blades 106 that have a higher performance. Further, the control processor 114 may identify lower performing computing blades 106, which may ultimately be replaced. Further, the ranking may be used to identify which computing blades 106 of different manufacturers have a highest performance and/or efficiency. This information may be used for selecting computing blades 106.

In some embodiments, the tank 104 may include a temperature sensor 130, which is communicatively coupled to the control processor 114. The temperature sensor 130 may be integrally formed with the tank 104 or may be placed within an interior of the tank 104 for contacting the dielectric fluid. The temperature sensor 130 may be located on a side of the tank 104 or at a bottom of the tank 104, for example. The temperature sensor 130 may be used when the computing blades 106 do not include temperature sensors. Further, more than one temperature sensor 130 may be placed within the tank 104.

As shown in FIG. 1, the high performance computing platform 100 includes a first closed fluid loop FL1 for the dielectric fluid and a second closed fluid loop FL2 for a cooling fluid, such as purified water. Both fluid loops FL1 and FL2 pass through a fluid heat exchanger 140. The fluid loop FL1 includes a from-tank line 142 that has a first end connected to an outlet port 143 of the tank 130 and a second end connected to a first input end of the fluid heat exchanger 140. The fluid loop FL1 also includes a to-tank line 144 that has a first end connected to an outlet end of the fluid heat exchanger 140 and a second end that is connected to an inlet port 146 of the tank 104. A dialectic fluid pump 148 is provided along the to-tank line 144 to pump cooled dielectric fluid from the fluid heat exchanger 140 to the tank 104. The pumping of the dielectric fluid by the fluid pump 148 also causes heated dielectric fluid to be pulled from the tank 104 via the outlet port 143. In some embodiments, the fluid pump 148 may instead be located along the from-tank line 142. Alternatively, the from-tank line 142 and the to-tank line 144 may each include a fluid pump 148.

The fluid manifold is configured to cool or otherwise remove heat from the dielectric fluid using the fluid loop FL2. A from-source line 150 includes a first end that is fluidly coupled to a fluid source 152 and a second end that is fluidly coupled to an input end of the fluid heat exchanger 140. In the illustrated example, the fluid source 152 includes a tank or container. The fluid source 152 may be source of cooling fluid. A to-source line 154 includes a first end that is fluidly coupled to an outlet end of the fluid heat exchanger 140 and a second end that is fluidly coupled to the fluid source 152.

While the inlet port 146 and the outlet port 143 are shown positioned at the bottom of the tank 104, in other embodiments one or both of the ports 143 and 146 (and/or additional ports) may be positioned in other locations. For example, the inlet port 146 may be positioned at a bottom of the tank 104 while the outlet port 143 is positioned at a top of the tank 104. Alternatively, the inlet port 146 may be positioned along a side of the tank 104 while the outlet port 143 is positioned along an opposite side of the tank 104. A number of ports and a positioning of the ports 143 and 146 across from each other helps induce a fluid flow across the computing blades 106. In some embodiments, one or more manifolds with apertures or slits may be included to help direct the fluid flow across the parallel computing blades 106.

A cooling fluid pump 156 is positioned along the to-source line 154 to pump the cooling fluid along the fluid loop FL2. In other embodiments, the fluid pump 156 is located along the from-source line 150 and/or two pumps are located respective along the lines 152 and 154. Water or another cooling fluid is circulated through the fluid loop FL2 using the fluid pump 156. Specifically, the pump 156 is configured to pull cooled fluid from the fluid source 152 through the fluid heat exchanger 140, which causes the cooling fluid to absorb heat from the dielectric fluid. Heated cooling fluid is then returned to the fluid source 152 for cooling.

As shown in FIG. 1, the fluid source 152 is positioned adjacent to an air heat exchanger 160. One or more blowers or fans 162 are configured to push air across the air heat exchanger 160 to remove heat from the cooling fluid within the fluid source 152. The air may be pulled from an ambient environment or include cooled air from a tank or other source.

In the illustrated embodiment, the control processor 114 is communicatively coupled to the fluid pumps 148 and 156. The control processor 114 is configured to transmit signals and/or comments for setting a speed of the fluid pumps 148 and 156. In some instances, the pumping speed is based on a desired temperature for the dielectric fluid within the tank 104 or desired temperature for the computing blades 106. In other instances, the control processor 114 may speed up or slow down pumping speeds of the fluid pumps 148 and 156 using a closed feedback control system to ensure a temperature for the dielectric fluid within the tank 104 or temperature for the computing blades 106 does not exceed a specified threshold, such as 60° C. or 75° C. For instance, after detecting that at least some of the computing blades 106 within the tank 104 are operating at a temperature that is over 75° C., the control processor 114 is configured to increase a speed of one or more of the pumps 148 and 156 to increase cooling.

In some embodiments, the control processor 114 uses one or more of the algorithms defined by the firmware 116 estimate or predict temperature increases based on current or known future computational demand. For instances, the control processor 114 may detect that relatively intense Proof of Work mining is to initiate and accordingly proactively increase a speed of the fluid pumps 148 and 156. The increase may be detected by the control processor 114 based on an increased number of operations or queries to be processed. In some embodiments, assuming the air heat exchanger 160 can maintain the cooling fluid between 10° C. and 20° C. within the fluid source 152, the fluid loop FL2 can reduce the temperature of the dielectric fluid by a degree per minute for every 1000 millimeters ("mL") per minute of cooling fluid pumped by the fluid pump 156. In this example, the control processor 114 can reduce the temperature of the dielectric fluid within the fluid loop FL1 by 2° C. per minute by increasing the speed of the fluid pump 156 to 2000 mL/minute. In a similar manner, the control processor 114 is configured to reduce a temperature of the dialectic fluid within the tank 104 by 0.25° C. per minute for every 1000 mL per minute of dielectric fluid pumped by the fluid pump 148.

Figure 2:
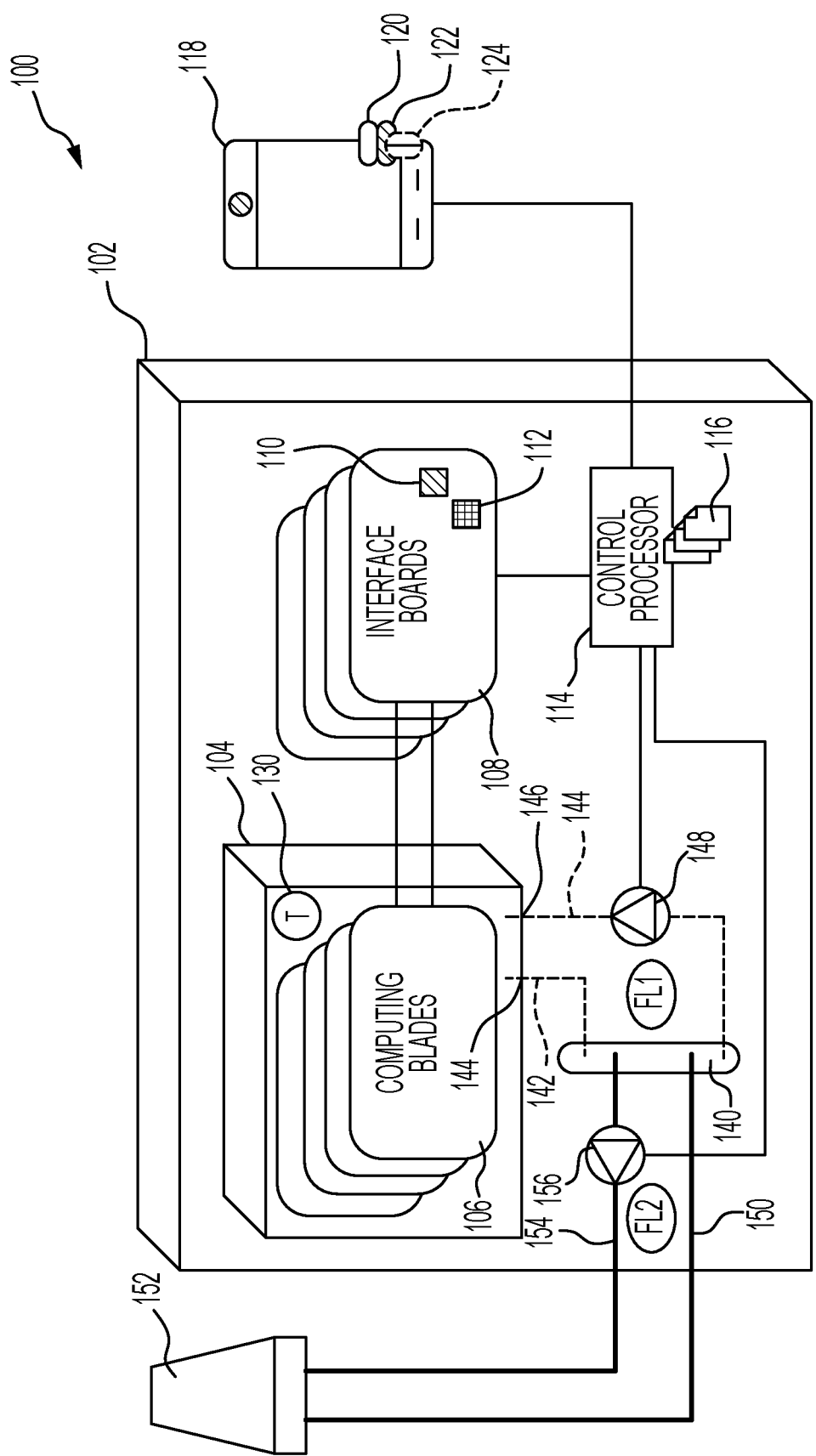
FIG. 2 is an alternative embodiment of the self-contained mobile high performance computing platform of FIG. 1, according to an example embodiment of the present disclosure.

FIG. 2 is an alternative embodiment of the mobile high performance computing platform 100, according to an example embodiment of the present disclosure. In this embodiment, the fluid source 152 includes a cooling tower that is fluidly coupled to the fluid loop FL2. The cooling tower may be located remote from the computing apparatus 102. In some embodiments, the cooling tower receives water from an online source, such as a municipality tap. Alternatively, the cooling tower receives water from one or more water tanks. The cooling tower may include a drain for disposing heated water.

Figure 3:
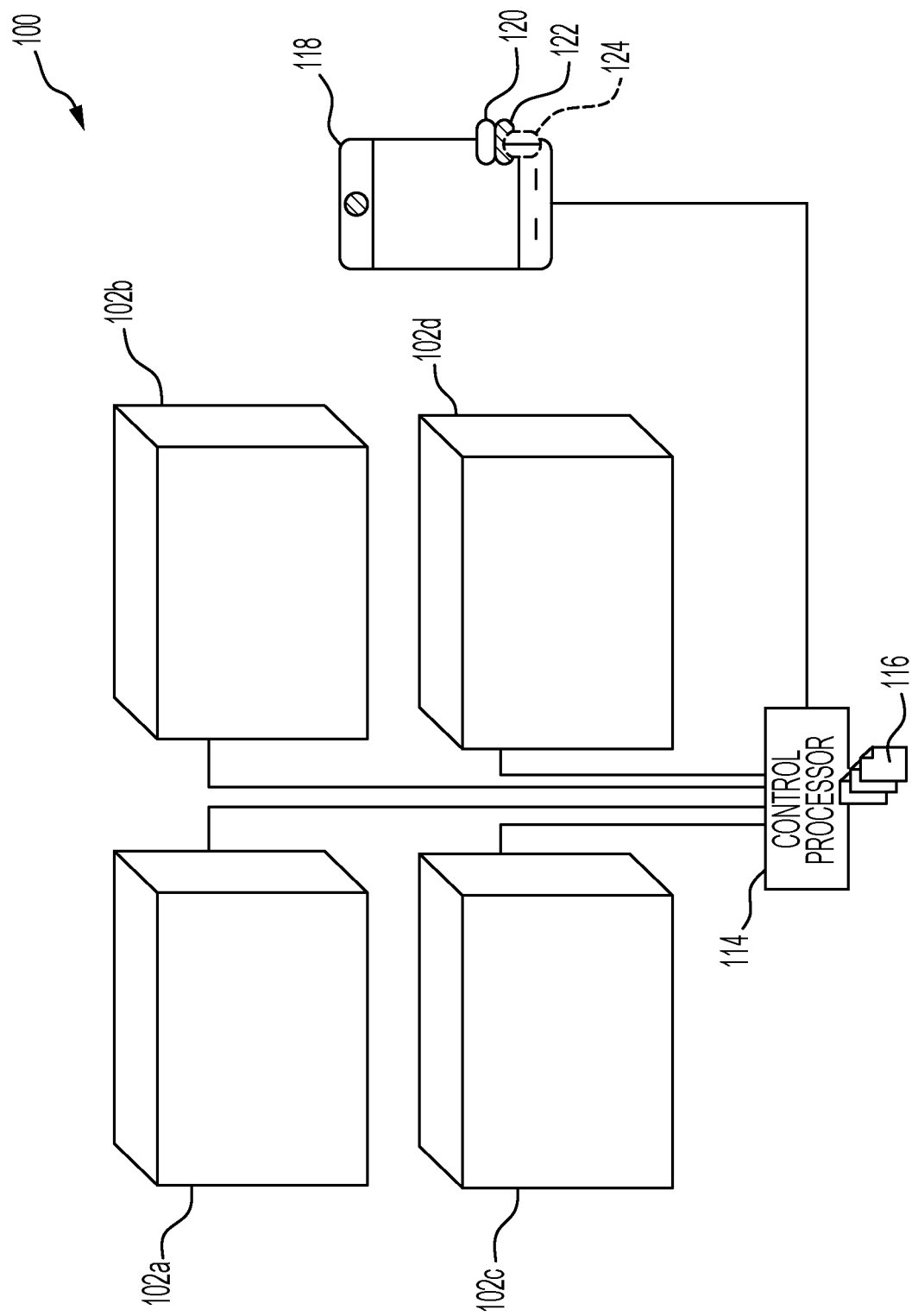
FIG. 3 is a diagram of the self-contained mobile high performance computing platform of FIG. 1 or 2 with four computing apparatuses, according to an example embodiment of the present disclosure.

FIG. 3 is a diagram of the mobile high performance computing platform 100 of FIG. 1 or 2 with four computing apparatuses 102a, 102b, 102c, and 102d, according to an example embodiment of the present disclosure. In this example, each of the computing apparatuses 102a, 102b, 102c, and 102d is similar to the computing apparatus 102 of FIGS. 1 and 2. However, in this example, a single control processor 114 is communicatively coupled to each of the computing apparatuses 102a, 102b, 102c, and 102d since each of the computing apparatuses are part of a same cabinet or enclosure. The control processor 114 is configured to manage coin mining operations among the computing apparatuses 102a, 102b, 102c, and 102d as a single point of communication for the client device 118. The control processor 114 is also configured to monitor performance and/or temperature for each of the computing apparatuses 102a, 102b, 102c, and 102d. The control processor 114 accordingly enables the mobile high performance computing platform 100 to be scaled further by adding and removing entire computing apparatuses as demand warrants without affecting operations of the other computing apparatuses.

Cabinet Embodiments

Figure 4:
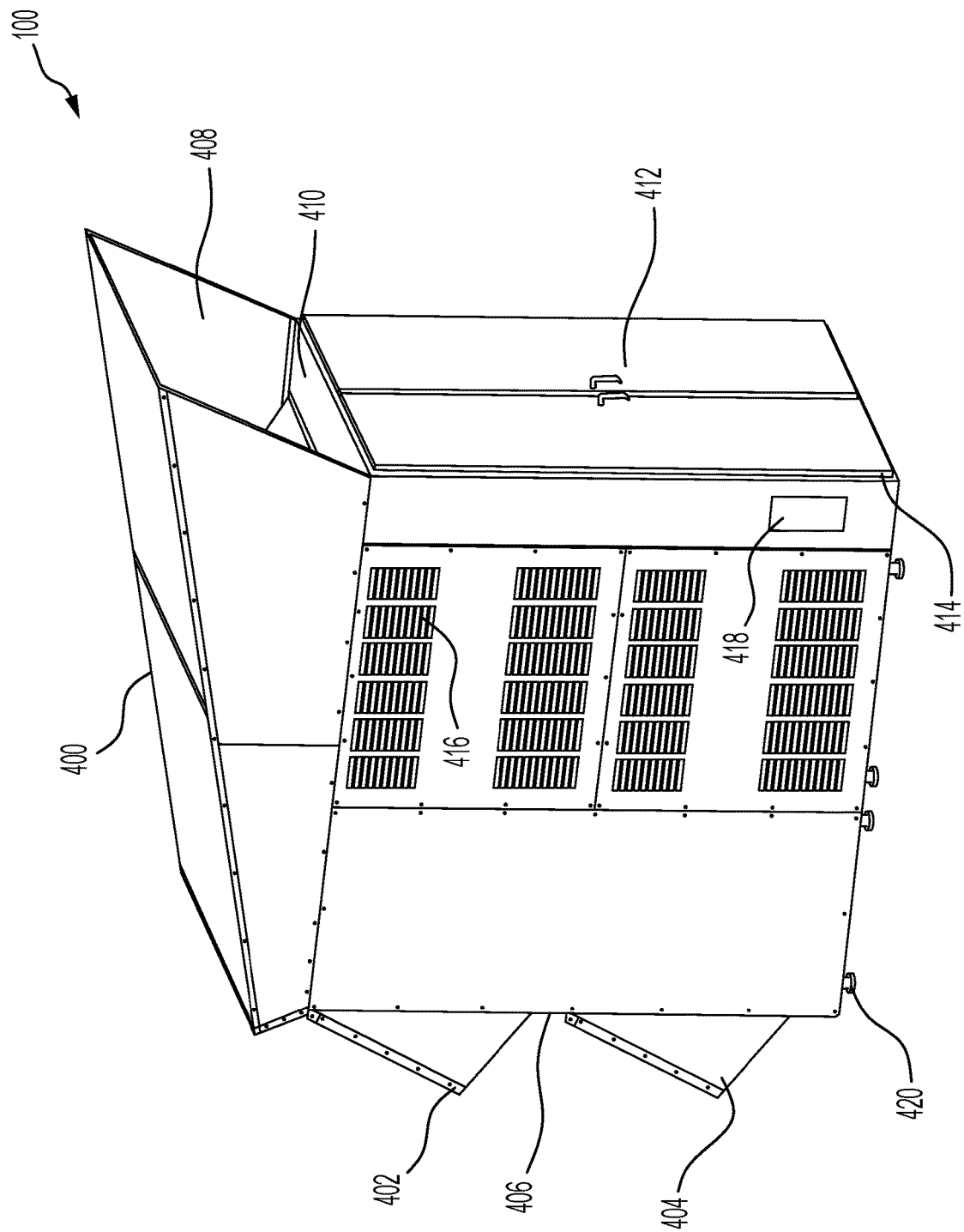
FIGS. 4 and 5 are diagrams of a cabinet for the self-contained mobile high performance computing platform of FIGS. 1 and 3, according to an example embodiment of the present disclosure.
Figure 5:
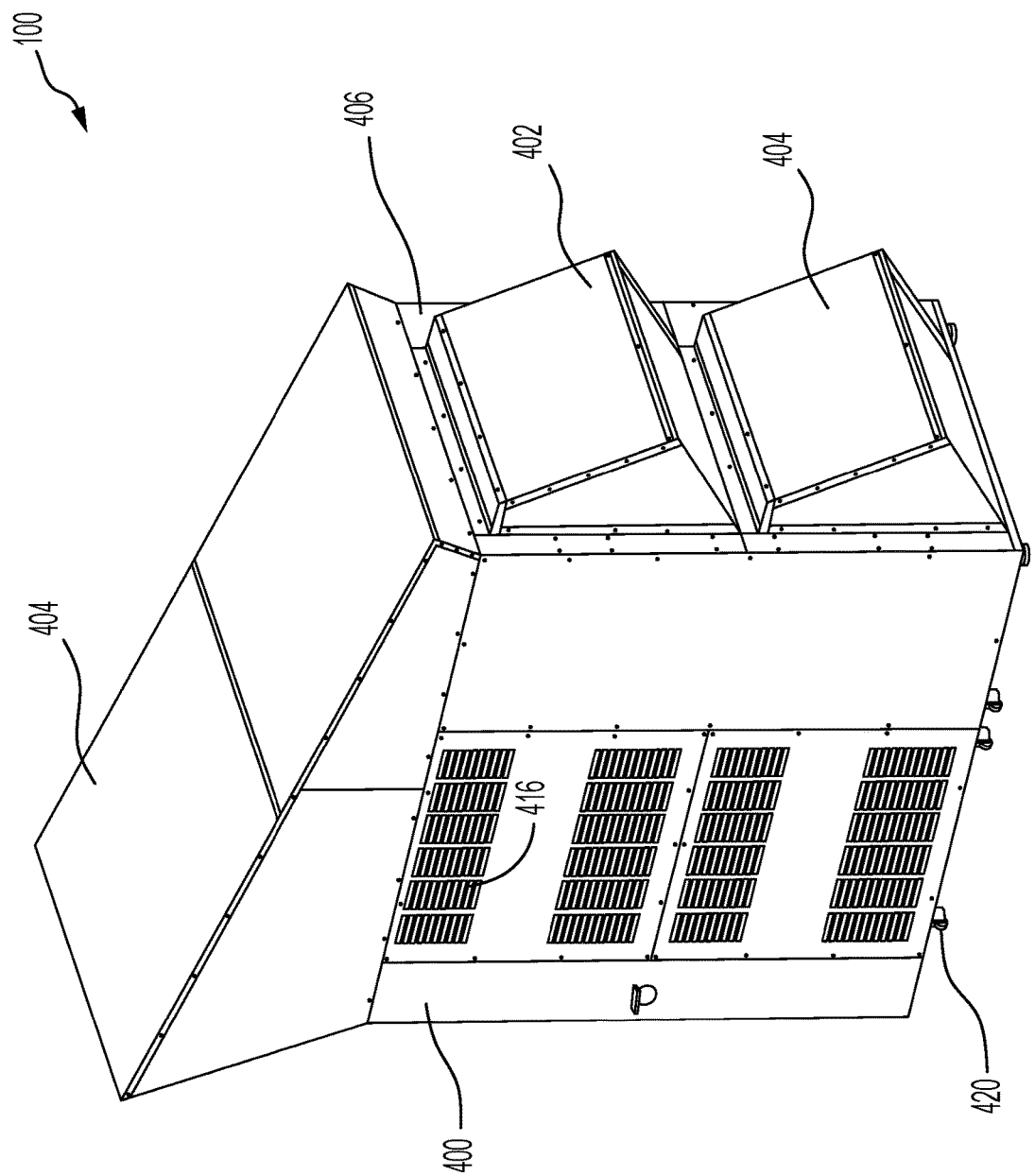

As discussed above, the computing apparatus 102 of FIGS. 1 to 3 may be contained within a cabinet or other enclosure. FIGS. 4 and 5 are diagrams of a cabinet 400 for the mobile high performance computing platform 100, according to an example embodiment of the present disclosure. As shown in FIGS. 4 and 5, the cabinet 400 may be used for the computing apparatus 102 described in connection with FIG. 1 in which an air heat exchanger 160 and a fan 162 are used. The cabinet 400 includes air intakes 402 and 404 that are located along a rear panel 406. Each air intake 402 and 404 may be aligned with a shelf located inside of the cabinet 400. Each shelf may contain one or more computing apparatuses 102. In some embodiments, the cabinet 400 may be smaller and only include one shelf and one air intake 404. In other embodiments, the cabinet 400 may be larger and include three or four shelfs and two or more air intakes. The air intakes 402 and 404 are configured to provide a passageway through which the blower or the fan 162 pulls air for circulation over the air heat exchanger 160. In some instances, a blower or fan 162 may be aligned with each air intake 402 and 404.

The cabinet 400 also includes a vent or air exhaust 408 that is located along a top panel 410. The air exhaust 408 is configured to face forward for alignment to an external exhaust or vent to enable blown air from the fan 162 to leave the cabinet 400 after passing over or through the air heat exchanger 160. The air intakes 402 and 404 are directionally aligned with the air exhaust 408 such that cooler air is pulled into the cabinet 400 and passes over the air heat exchanger 160 and then out of the air exhaust 408 without any additional impediments to restrict the air flow rate.

The cabinet 400 further includes at least one door 412 that is located along a front panel 414. The door 412 is configured to provide access to an interior of the cabinet 400. In some embodiments, the door 412 may be opened to provide further cooling. The door 412 is configured to cover the entire front panel 414, in some embodiments, to enable the computing apparatus 102 to be removed or installed. Further, the door 412 enables an operator to service one or more computing apparatus 102 (such as to replace a computing blade 106) without having to remove the computing apparatus from the cabinet 400.

In the illustrated example, the cabinet 400 may have a height between five and nine feet, preferably around seven feet. Further, the cabinet 400 may have a width between two and six feet, preferably around four or five feet. The vent or air exhaust 408 may extend an additional two or three feet above the top panel 410 at a front of the cabinet 400. Moreover, cabinet 400 may have a depth between seven and twelve feet, preferably around ten or eleven feet. In should be appreciated that in other embodiments the cabinet 400 may have other dimensions to enclose one or more computing apparatuses 102.

In additional embodiments, the cabinet 400 may further include vents 416 located on one or more side panels. The vents 416 provide for additional air circulation and heat disapplication. The cabinet 400 also includes one or more panels 418 for electrical and/or communication connections. The panel 418 may enable a main power bus to be routed from a mains power supply or a generator to the individual computing apparatuses 102 within the cabinet 400. The panel 418 may further enable, for example, an Ethernet connection to be routed from a router or Ethernet socket, through the cabinet, to the control processor 114.

The cabinet 400 further includes at least four wheels 420, which provide mobility. The wheels 420 may include heavy-duty caster wheels to support the weight of the cabinet 400 while at the same time enabling the cabinet 400 to be moved. The wheels 420 may include locks to secure the cabinet 400 in place.

Figure 6:
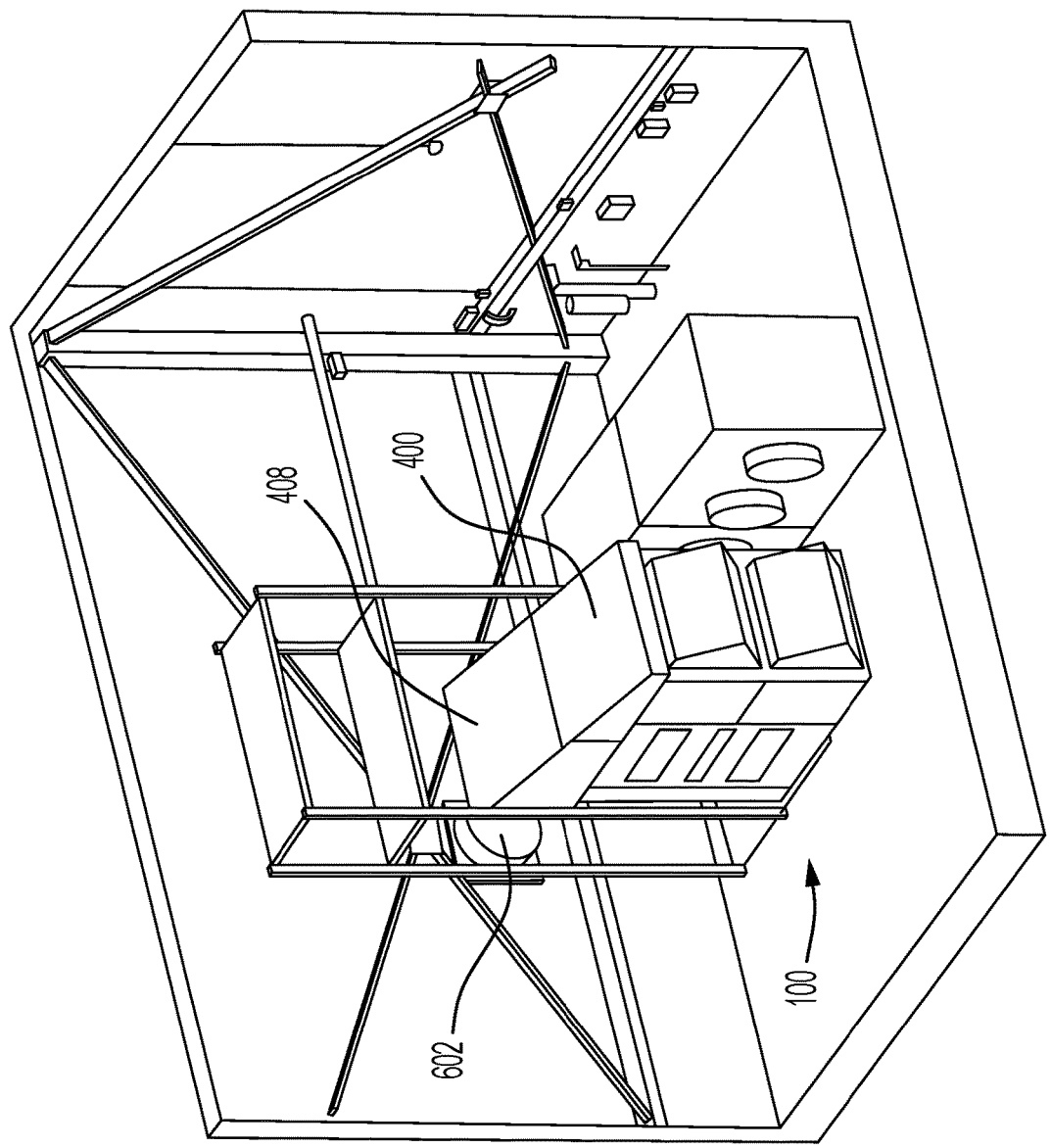
FIG. 6 is a diagram of the cabinet of FIGS. 4 and 5 placed within an indoor location, according to an example embodiment of the present disclosure.

FIG. 6 is a diagram of the cabinet 400 of FIGS. 4 and 5 placed within an indoor location, according to an example embodiment of the present disclosure. The indoor location may include a warehouse, an office, a garage, a basement, etc. The compact and mobile nature of the cabinet 400 enables the mobile high performance computing platform 100 to be located virtually anywhere. In the illustrated example, the air exhaust 408 is aligned and/or fluidly coupled to an external exhaust 602. The coupling enables heated air to be directed outside of a room or a building. The external exhaust 602 may include one or more blowers or fans 162 that directs air outside of a building.

Figure 7:
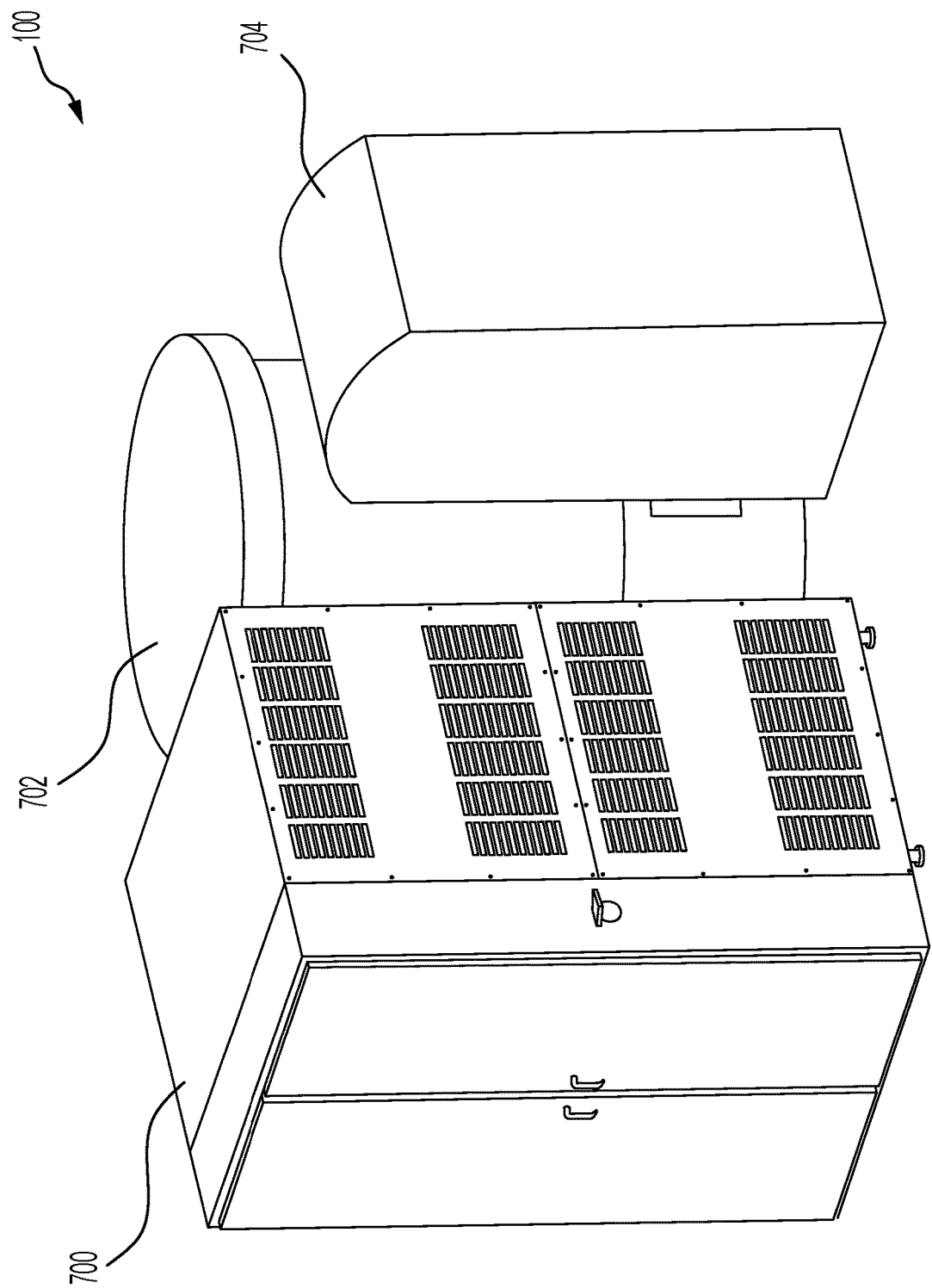
FIGS. 7 and 8 are diagrams showing a fluid coupling between a cabinet within one or more computing apparatus and a cooling tower, according to an example embodiment of the present disclosure.
Figure 8:
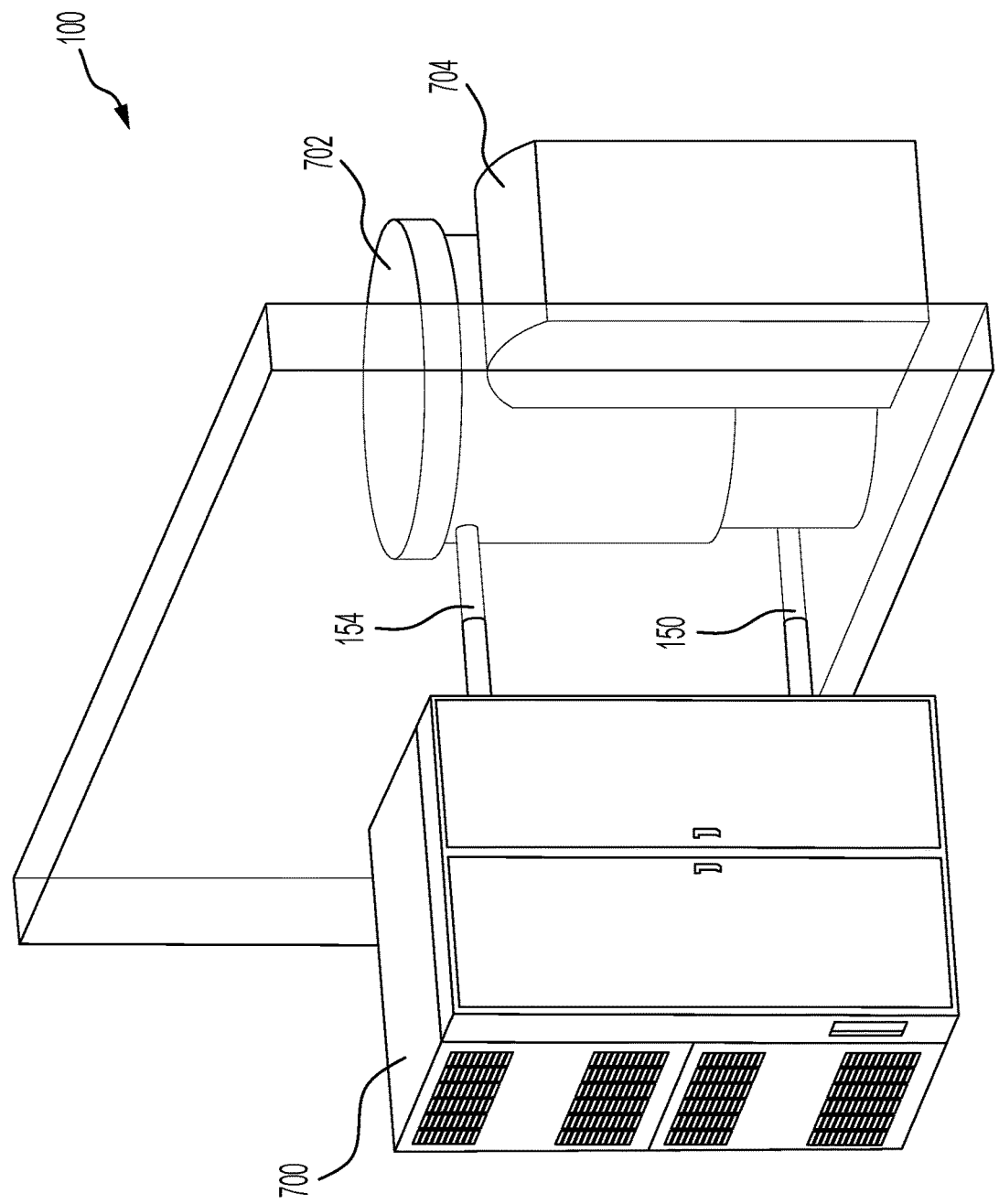

As discussed above in connection with FIG. 2, the mobile high performance computing platform 100 may include a fluid loop FL2 that is connected to a cooling tower. FIGS. 7 and 8 are diagrams showing the fluid coupling between a cabinet 700 within one or more computing apparatus 102 and a cooling tower 702 (e.g., a cooling fluid source 152). Instead of having air intake and exhaust vents, the cabinet 700 is connected to the cooling tower 702 via the from-source line 150 and the to-source line 154. The cooling tower 702 may include a drift eliminator, a distribution spray system, wet decking, and a tower shell for removing heat from the cooling fluid. The cooling tower 702 also includes a blower housing 704 for pulling in ambient or cooled air for removing heat from the cooling fluid within the cooling tower 702.

FIG. 7 shows the cooling tower 702 and the blower housing 704 located adjacent to the cabinet 700. FIG. 8 shows the cooling tower 702 and the blower housing 704 located separate from the cabinet 700. In some instances, the cooling tower 702 and the blower housing 704 may be located in another room or outside. The use of the cooling tower 702 enables the cabinet 700 to be placed in a relatively restricted location or in close proximity with other cabinets 700.

FIGS. 9 to 12 show four computing apparatuses 102 of the mobile high performance computing platform 100 positioned inside a rack 900, according to an example embodiment of the present disclosure. The rack 900 is configured to be placed within the cabinets 400 and 700 of FIGS. 4 to 8. In some embodiments, the rack 900 is integrally formed with the insides of the cabinets 400 and 700. Alternatively, the rack 900 may be removable from the cabinets 400 and 700.

The example rack 900 includes a frame that supports four computing apparatuses 102 within separate quadrants. For example, the computing apparatus 102a is located in an upper-right quadrant and the computing apparatus 102d is located in a lower-left quadrant. Each of the computing apparatuses 102 are electrically coupled to a power circuit board 902, which may receive power from a mains power source or a generator. The power circuit board 902 includes a plurality of circuit breakers, switches, buses, and power routers 904 for distributing and routing power to each of the interface boards 108 of the computing apparatuses 102. The power circuit board 902 may face the door 412 of the cabinets 400 and 700 to enable easy operator access.

The power circuit board 902 may also include a display screen 906 for each computing apparatus 102. The display screen 906 may display a status of the computing apparatus 102, such as a power consumption, temperature of the respective tank 104, and/or an indication of any malfunctioning computing blades 106. The display screen 906 may also include one or more controls for setting an operation of the computing apparatus 102.

The power circuit board 902 may further include the control processor 114. As described above, the control processor 114 may include a transceiver for wireless or wired communication with one or more client devices 118. Further, the control processor 114 is communicatively coupled to each of the interface boards 108 of the computing apparatuses 102 via a wired connection. The control processor 114 may select information for display on each display screen 906 in addition to managing operation based on inputs received by the controls provided in conjunction with the display screen 906.

Figure 10:
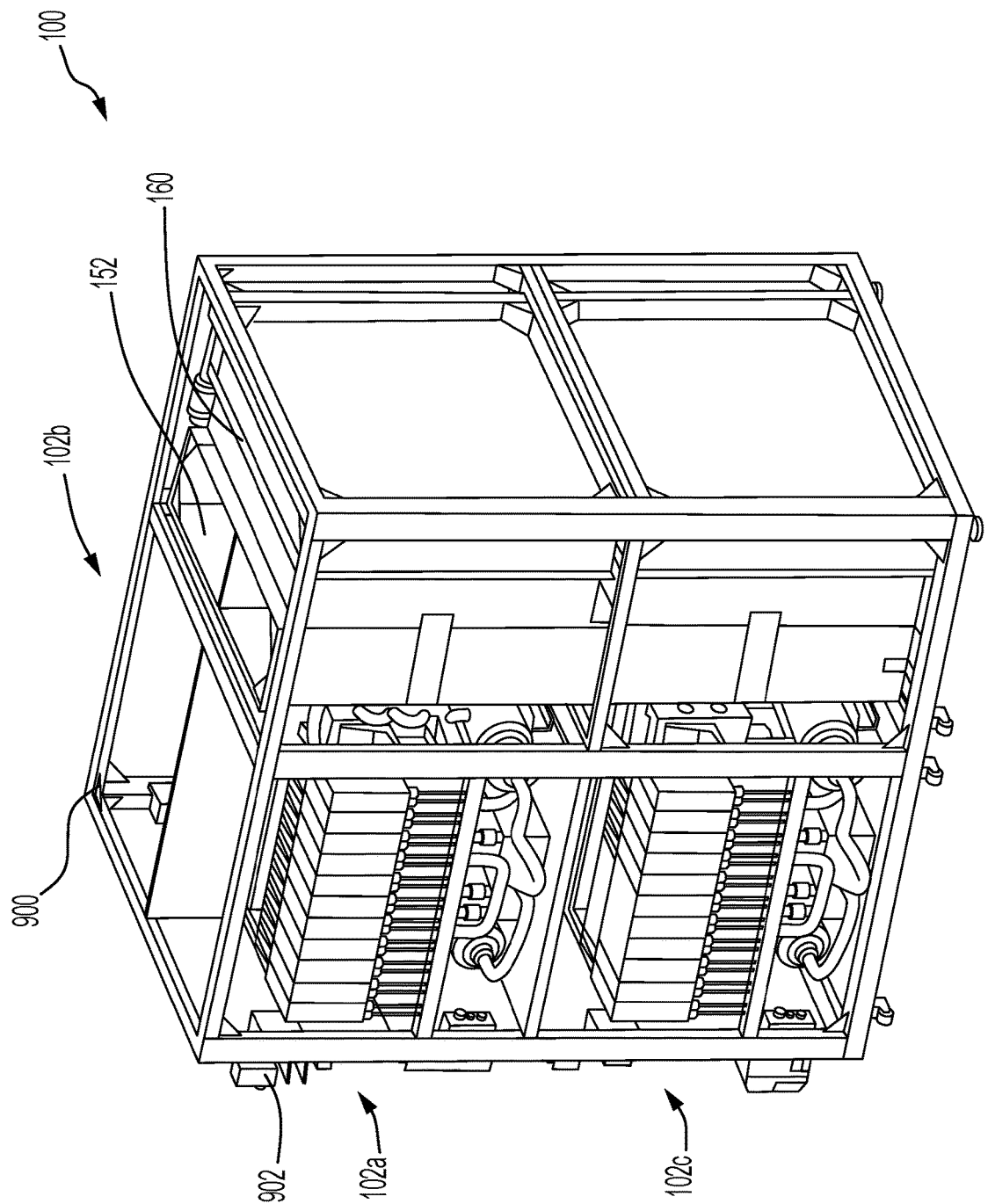

FIG. 10 shows a rear view of the rack 900. Each computing apparatus 102 may include a separate fluid source 152. When the cooling tower 700 is used, the cabinet 700 include a single from-source line 150 and a single to-source line 154, as shown in FIG. 8. However, the lines 150 and 154 may be branched to each computing apparatus 102. In some instances, each branch may be fluidly coupled to a local fluid source 152 to enable the fluid pump 156 of each computing apparatus 102 to be operated at a different speed.

In the illustrated example, FIG. 10 also shows the air heat exchanger 160, which is placed adjacent to the fluid sources 152. One air heat exchanger 160 may be used within the rack 900. Alternatively, each of the computing apparatuses 102 may have a separate air heat exchanger 160.

Figure 9:
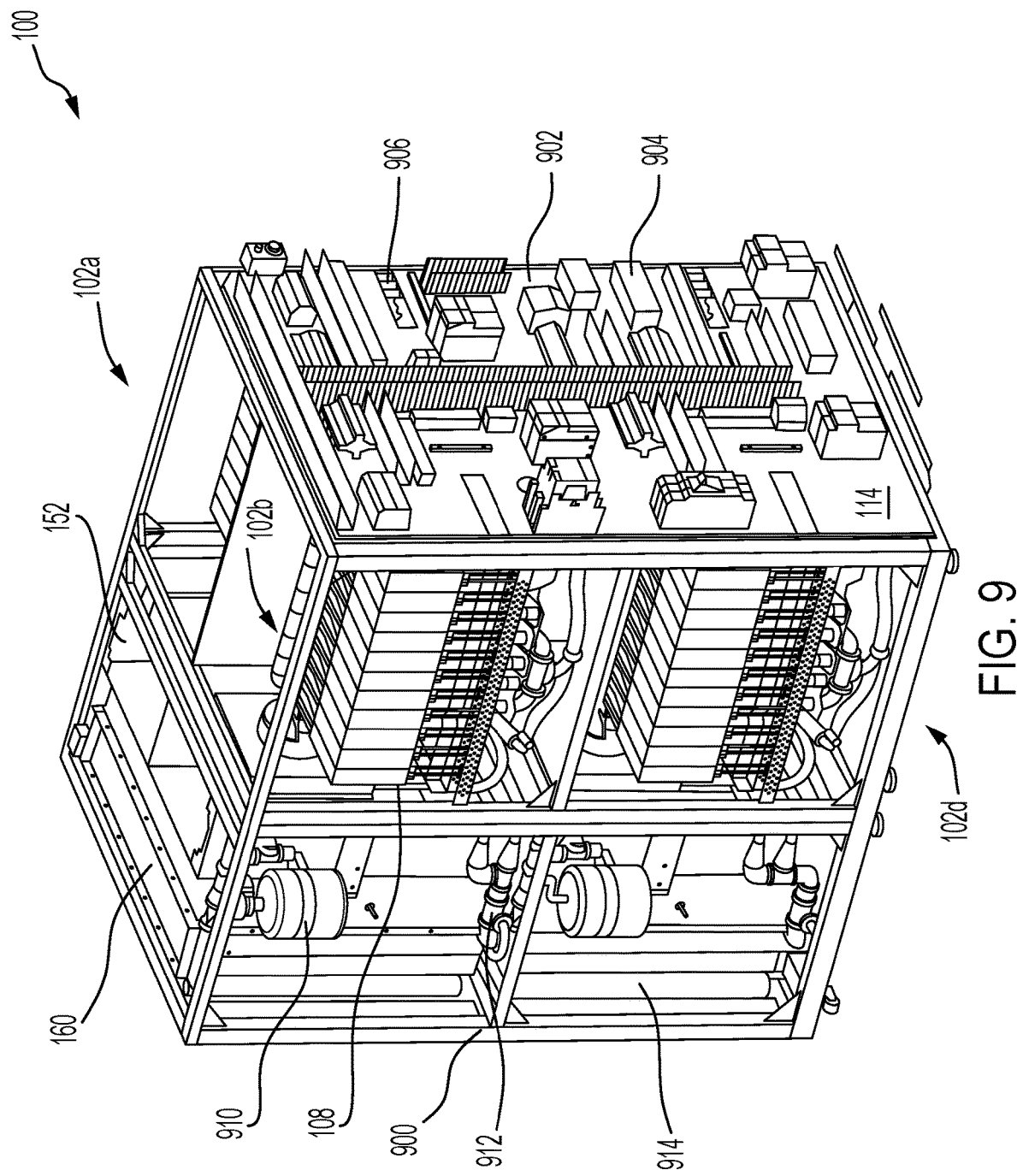
FIGS. 9 to 12 are diagrams of four computing apparatuses of the mobile high performance computing platform positioned inside a rack, according to an example embodiment of the present disclosure.
Figure 11:
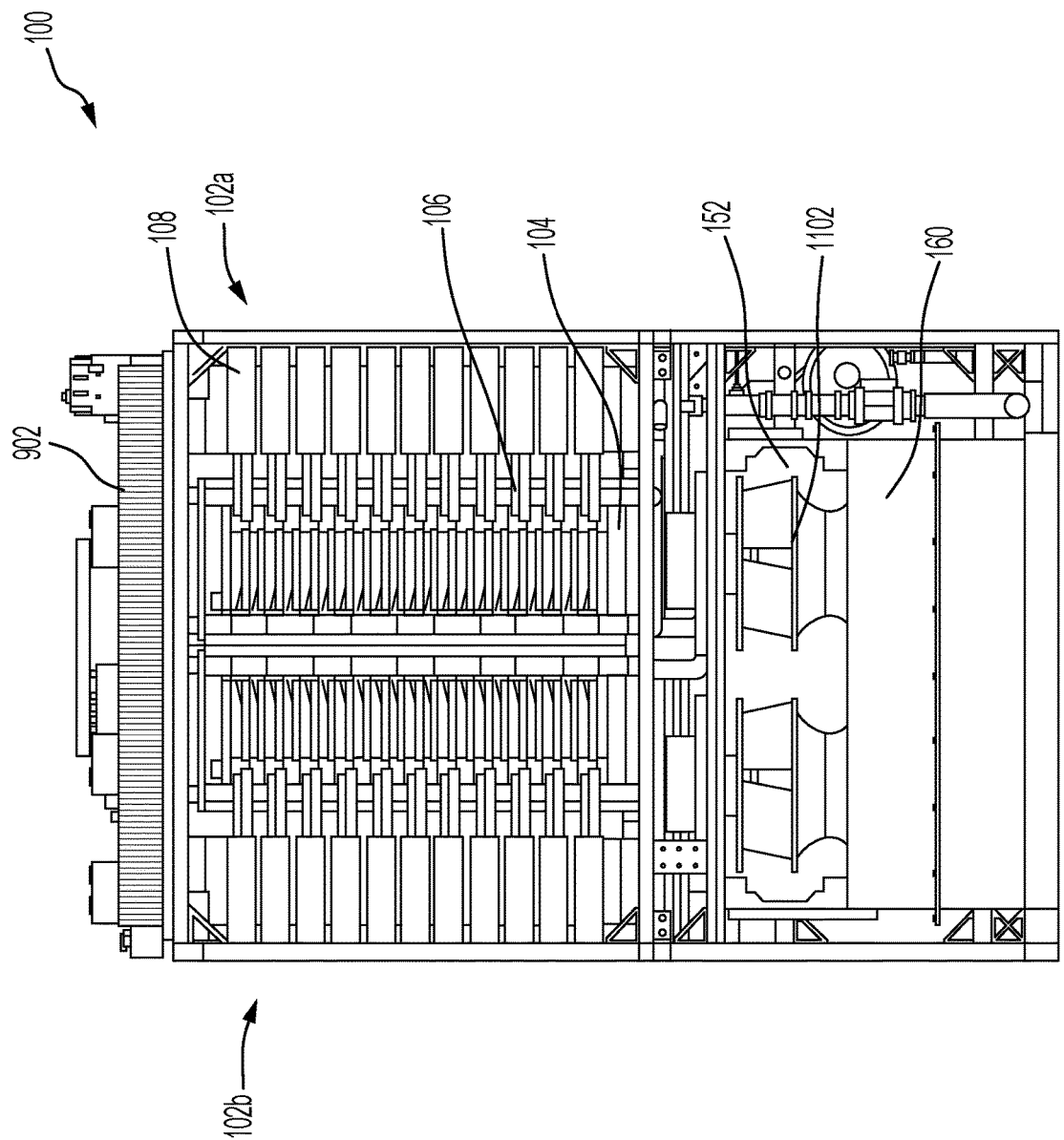

FIG. 11 shows a plan view of the rack 900 of FIGS. 9 and 10, according to an example embodiment of the present disclosure. The computing apparatuses 102a and 102b are located adjacent to each other. As shown, each computing apparatus 102 includes a tank 104 that holds dielectric fluid. Computing blades 106 are immersed in the dialectric fluid for cooling. Each of the computing blades 106 is electrically and communicatively coupled to an interface board 108, which are located outside and adjacent to the tank 104.

As shown in FIG. 11, a rear of the rack 900 contains the fluid source 152 and the air heat exchanger 160. In some embodiments, the air heat exchanger 160 may include a fluid interface 1102 to enable the cooling fluid to mix or otherwise release heat into a metallic structure. An opposite side of the air heat exchanger 160 at a rear of the rack 900 receives cooler air from the blower or fan 162.

Returning to FIGS. 8 and 9, the rack may further include pumps 910, valves/junctions 912, and/or lines 914 that further move cooling fluid along the air heat exchanger 160. The pumps 910 may pull cooling fluid from the fluid source 152. The pumps 910 then pump the cooling fluid via the valves/junctions 912 to the lines 914 that are positioned along the air heat exchanger 160.

Figure 12:
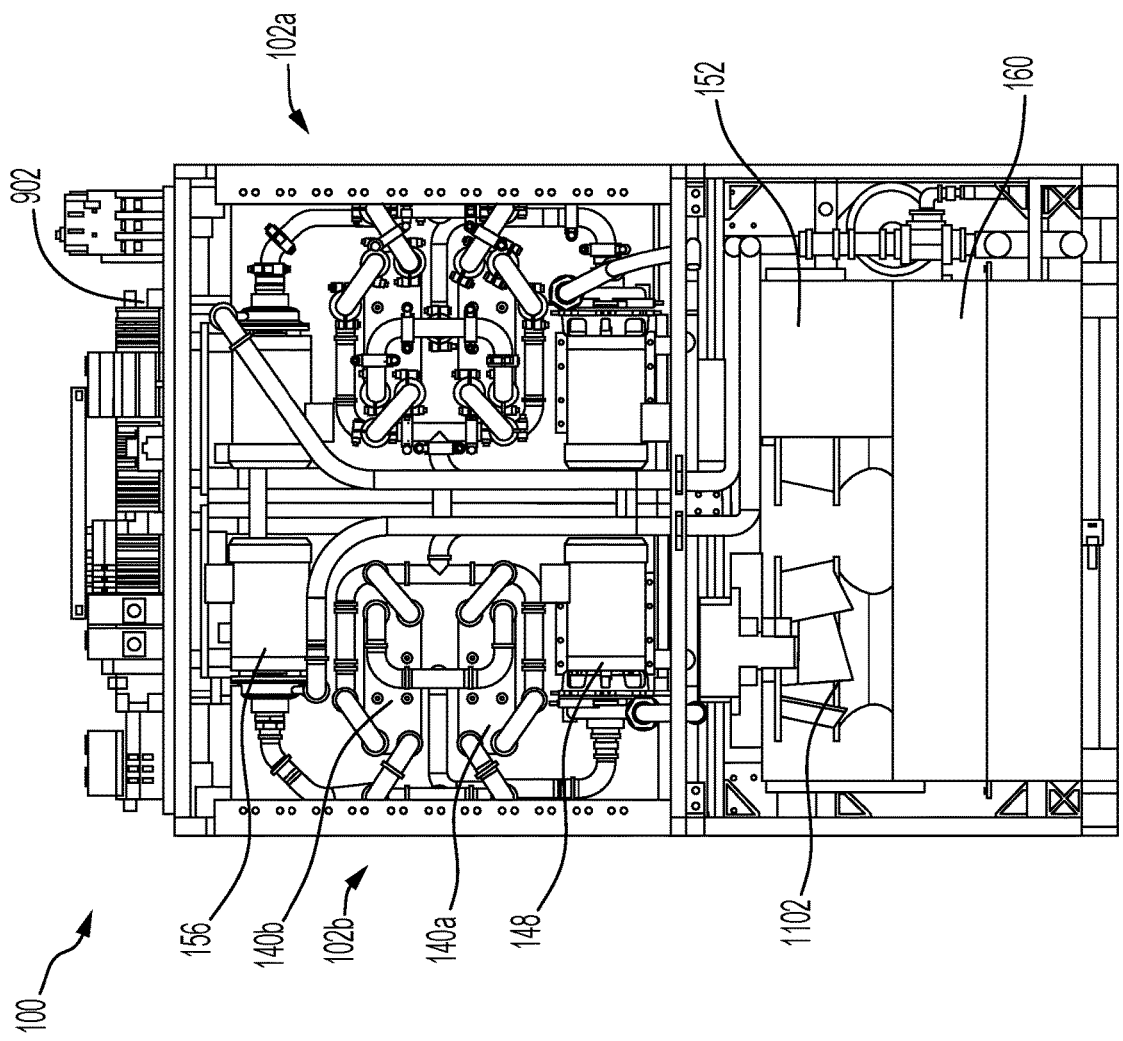
Figure 13:
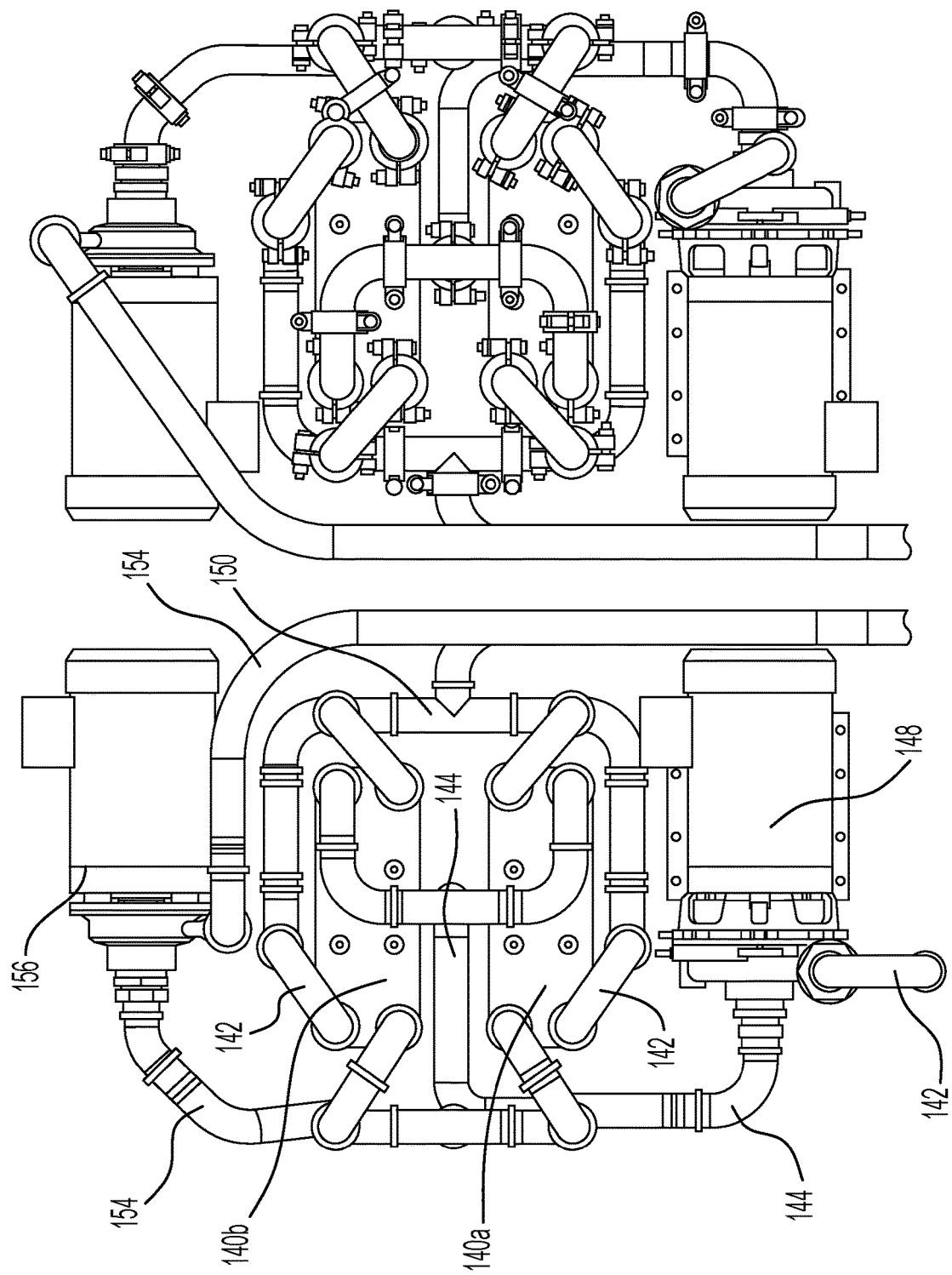
FIG. 13 is a diagram of a cooling fluid loop and a dielectric fluid loop of a computing apparatus, according to an example embodiment of the present disclosure.

FIG. 12 is a diagram of the rack 900 with the interface boards 108 and the tanks 104 of the computing apparatuses 102 removed, according to an example embodiment of the present disclosure. FIG. 12 shows the fluid routing of the cooling fluid and the dielectric fluid through the respective fluid loops FL1 and FL2. As discussed above in connection with FIG. 1, the dielectric fluid loop FL1 includes the fluid pump 148 and the cooling fluid loop FL2 includes the fluid pump 156. Each of the pumps 148 and 156 is fluidly coupled to two fluid heat exchangers 140a and 140b. As such, each of the lines 142, 144, 150, and 154 include branches to enable flow to both fluid heat exchangers 140a and 140b, as shown in more detail in FIG. 13. For example, cooling fluid flows through the from-source line 150, which is branched to flow to input ports of the fluid heat exchangers 140a and 140b. Cooling fluid exits the fluid heat exchangers 140a and 140b at exit ports, which are fluidly coupled together at the to-source line 154 before entering the fluid pump 156. Similarly, dielectric fluid flows through the from-tank line 142 to input ends of the fluid heat exchangers 140a and 140b. Dielectric fluid exits the fluid heat exchangers 140a and 140b at outlet ends, which are fluidly coupled together at the to-tank line 144 before entering the fluid pump 148.

Tank and Manifold Embodiments

Figure 14:
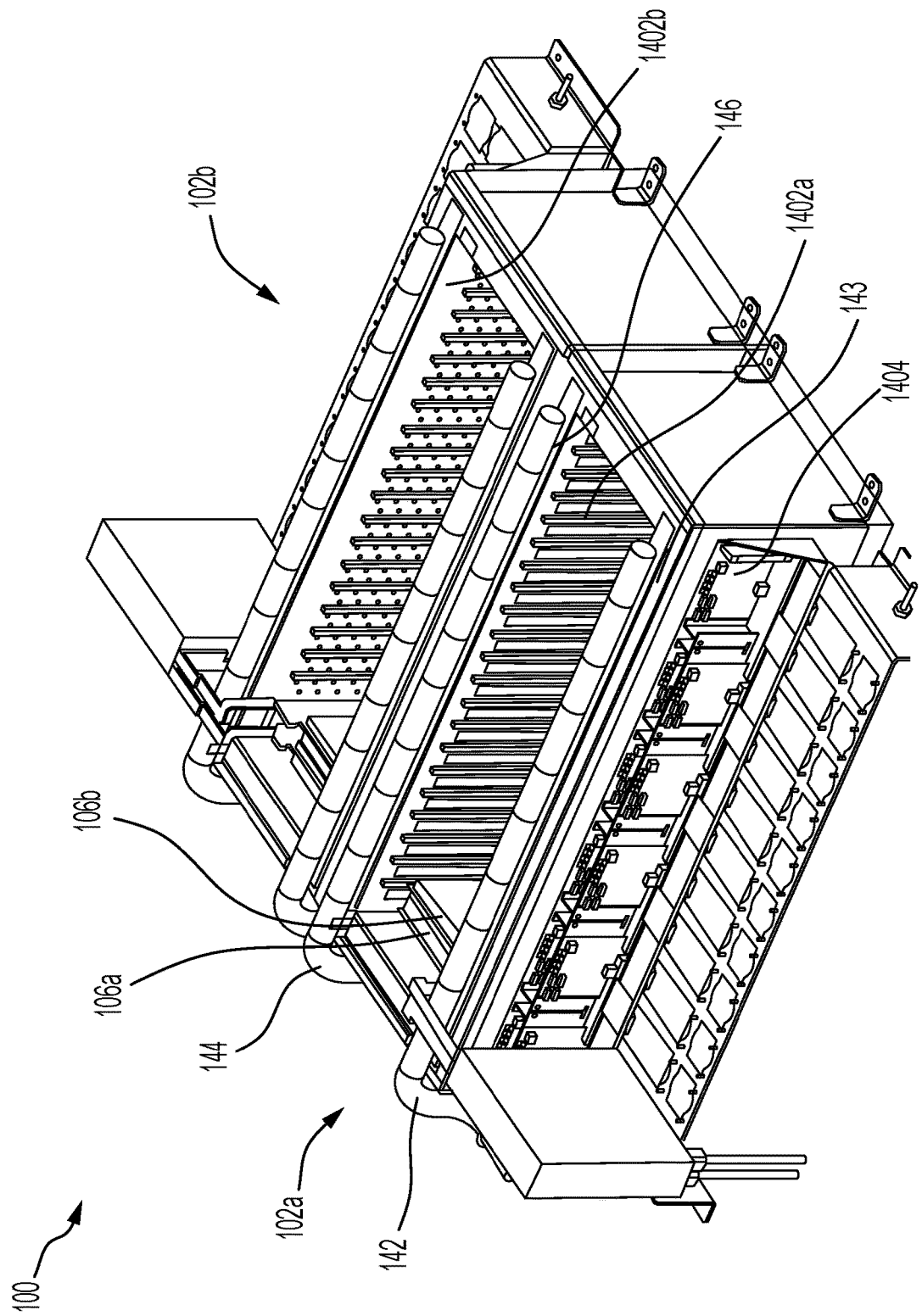
FIG. 14 is a diagram of an immersion tank of one of a computing apparatus, according to an example embodiment of the present disclosure.

Each of the computing apparatuses 102 of the mobile high performance computing platform 100 include a tank for immersing computing blades within a cooling dielectric fluid. FIG. 14 is a diagram of the tank 104 of one of the computing apparatuses 102, according to an example embodiment of the present disclosure. As shown, the tank has a rectangular shape for holding dielectric fluid. The tank 104 has an open top side to enable at least some heat to escape through the air. In the illustrated example, the tank 104 may be formed and welded from stainless steel sheets and have a length between 20 and 45 inches, preferably around 37 inches. The tank 104 has a width between 8 inches and 18 inches, preferable around 13 inches, and a depth between 8 inches and 16 inches, preferably 12 inches. In other examples, the tank 104 is sized differently based on a side of the computing blades 106.

In the illustrated example, the to-tank line 144 is routed along a top side of the tank 104. The from-tank line 142 is routed along an opposite side of the tank 104. The from-tank and to-tank lines 142 and 144 are coupled to the top sides of the tank 104 via tubes (e.g., the ports 143 and 146 of FIG. 1). The cooling fluid flows through the tubes to reach an interior of the tank 104. The tank 104 includes a manifold 1402 to direct the flow of the dielectric fluid across the computing blades 106. The dielectric fluid flows from the to-tank line 144, through the tubes (e.g., the inlet ports 146) to the manifold 1402, which includes slots or apertures. The dielectric fluid is pushed through the slots or apertures of the manifold 1402 across the computing blades 106. Outlet ports 143 are positioned within the tank 104 along the opposite side. The positioning of the manifold 1402, the inlet ports 146, and the outlet ports 143 creates a fluid path across the computing blades 106 within the tank 104 that helps to more efficiently remove heat.

Figure 15:
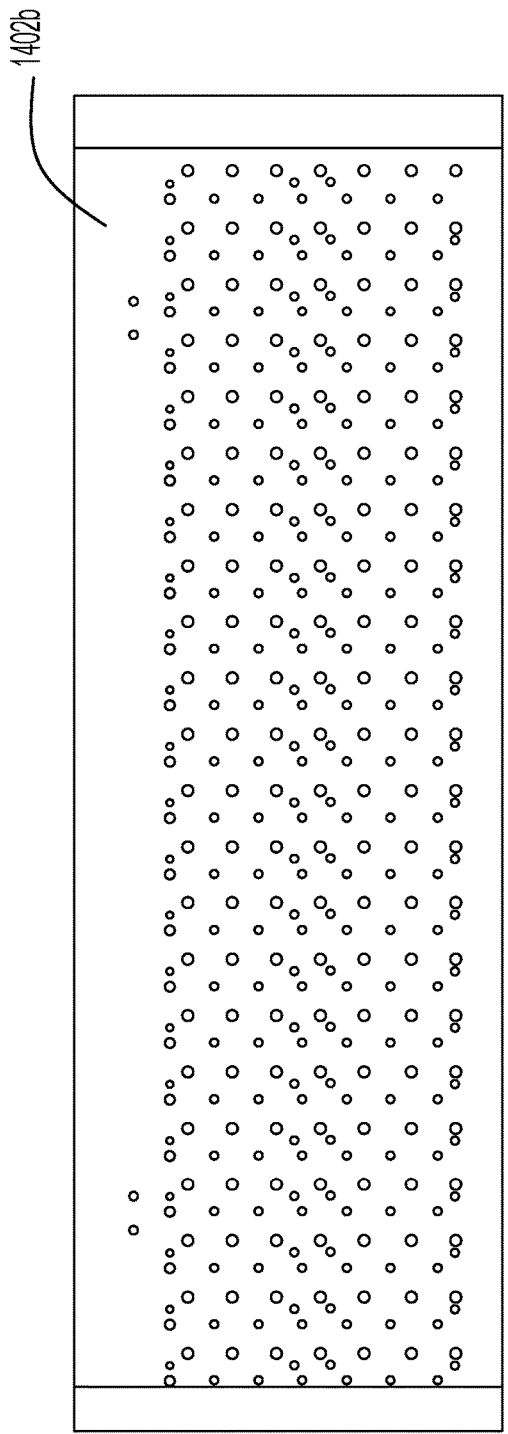
FIGS. 15 to 18 are diagrams of an immersion tank manifold of a computing apparatus, according to an example embodiment of the present disclosure.
Figure 16:
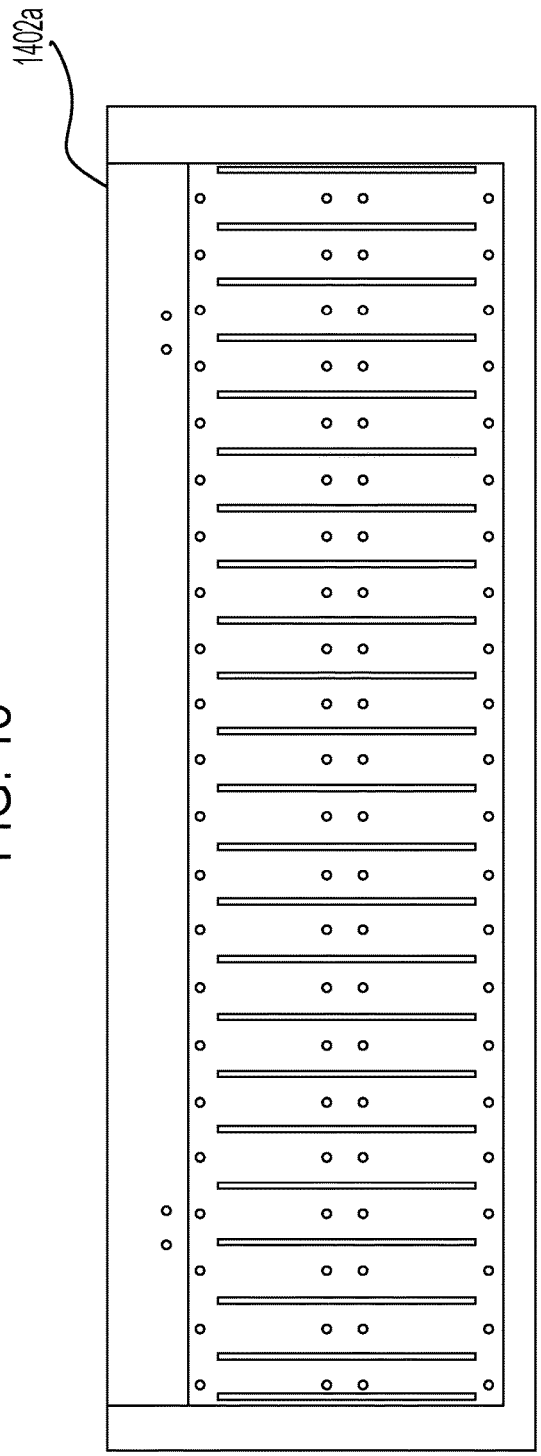

As shown in FIG. 14, different manifold designs may be used. The computing apparatus 102a includes a manifold 1402a with parallel vertically oriented slots. The computing apparatus 102b includes a manifold 1402b with apertures and vertically oriented slots. The different designs provide for different flow distributions of the dielectric fluid. FIG. 15 shows a diagram of the manifold 1402b with the circular apertures, which enable the dielectric fluid to enter the tank 104 at precise, rapid vortexes for flow across the computing blades 106. FIG. 16 shows a diagram of the manifold 1402a with the vertical slots. In this example, the manifold 1402a may include an adapter plate that is attached to a side of the tank 104. The slot design provides more laminar flow across the computing blades 106. According to the design of the computing blade 106 inside the tank 104, the design of the manifold 1402 may be optimized for a most efficient location and aperture style/size.

Figure 17:
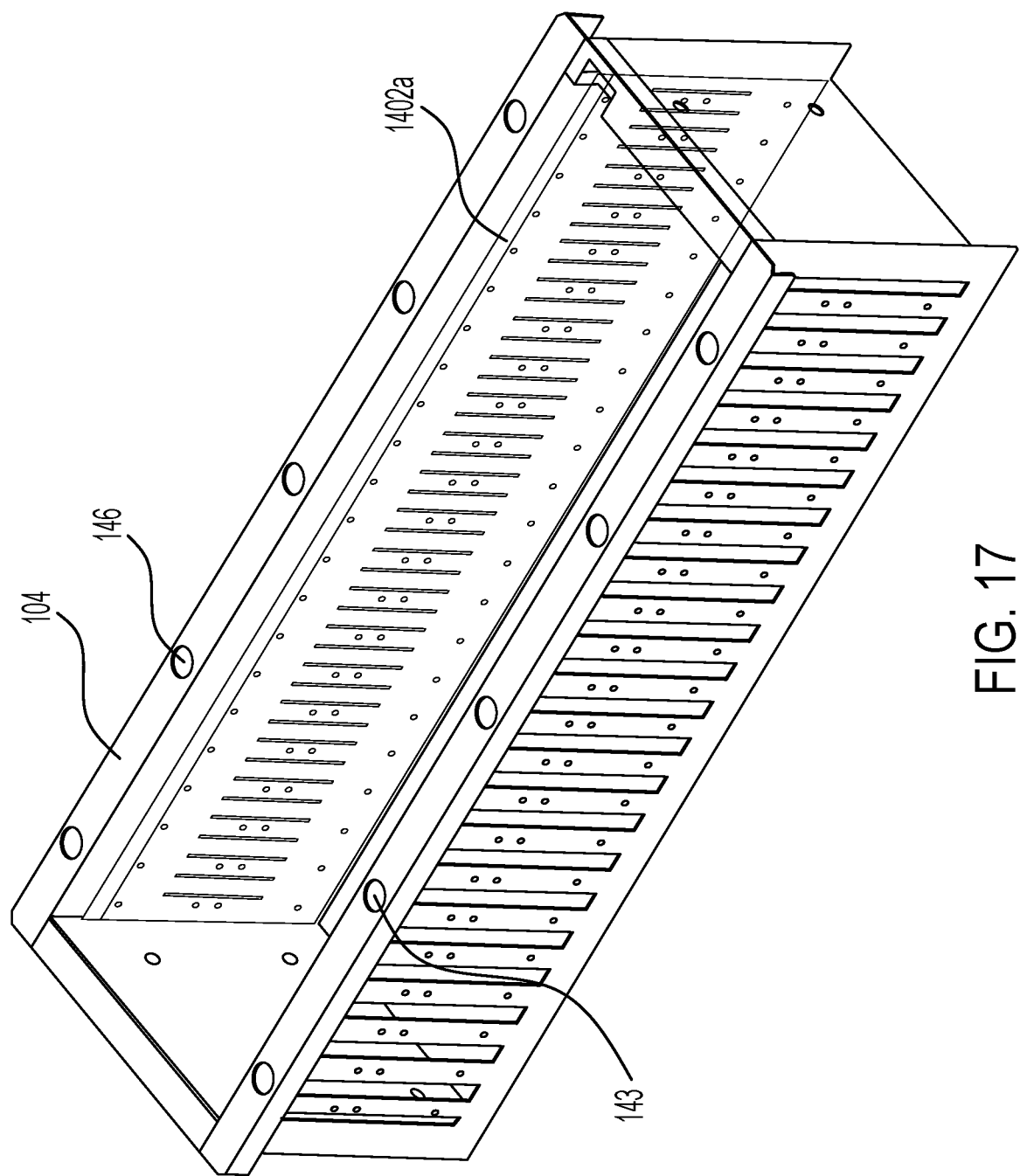

FIG. 17 shows a diagram of the manifold 1402a of FIG. 16 connected to the tank 104, according to an example embodiment of the present disclosure. FIG. 17 also shows locations of the inlet ports 146 and the outlet ports 143 of the tank 104, which enable the dielectric fluid to be cycled. The outlet ports 143 may be connected to tubing that extends into the dielectric fluid to enable fluid removal.

Figure 18:
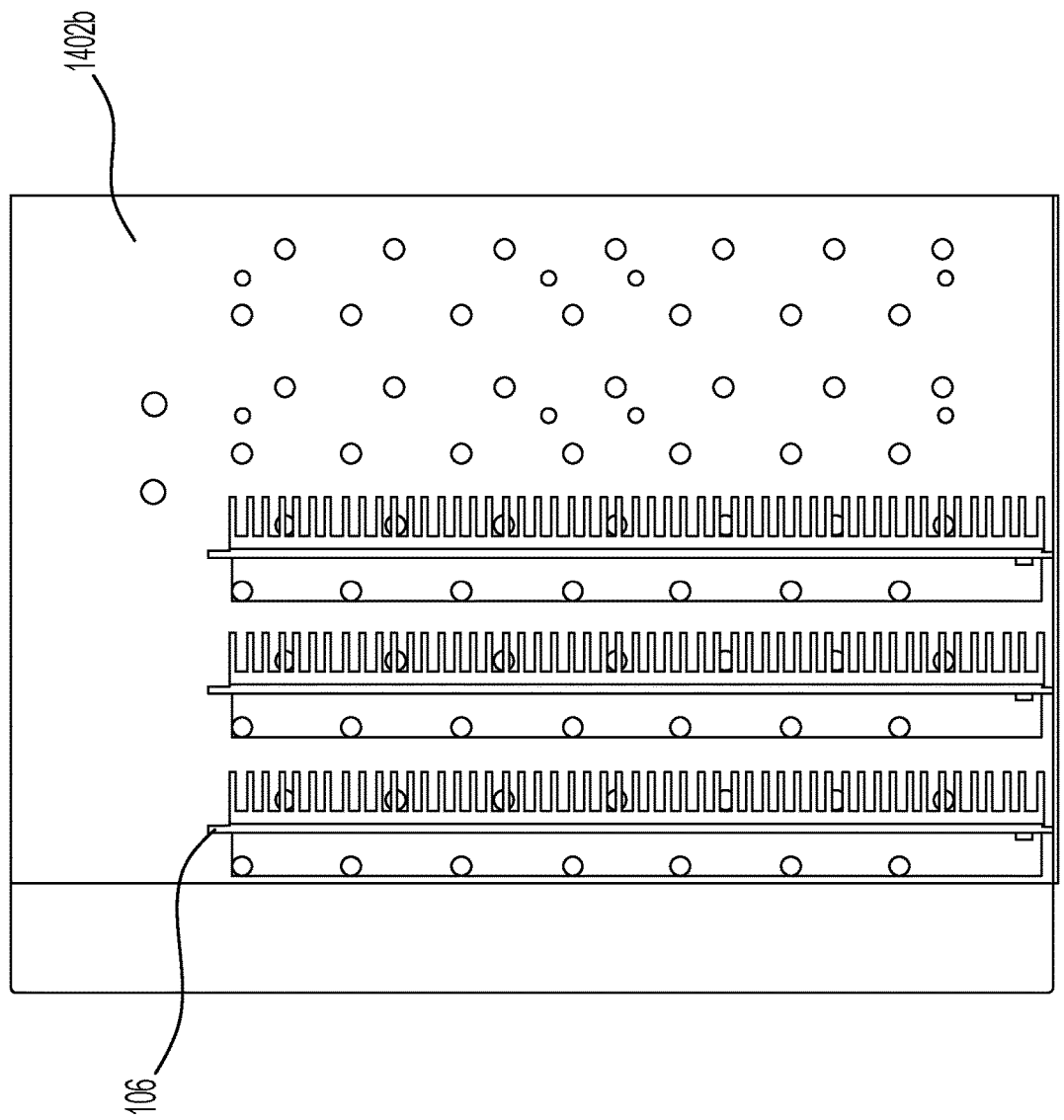

FIG. 18 shows a diagram of the manifold 1402b with the circular apertures, according to an example embodiment of the present disclosure. As shown, the circular apertures may each have the same or different diameters, which can be between 0.1 millimeters and 2 centimeters. The apertures are configured to align with the computing blades 106 to ensure the fluid vortex flow across the circuit board. The apertures are located along an entire height of the computing blade 106 to ensure the dialectic fluid flows along the entire circuit board. As shown, the efficient heat dissipation enables the computing blades 106 to be placed relatively close together in a vertical-orientation.

In the above-examples, the manifold 1402 is located along a side of the tank 104. In other embodiments, the manifold 1402 may be placed at a bottom of the tank 104. In these embodiments, the dielectric fluid is pushed upwards. The outlet ports 143 may be located at the top of the tank 104 to remove the heated dielectric fluid. This bottom-up approach is used when the computing blades 106 are optimized for a vertical flow of the dielectric fluid. This bottom-up approach also takes advantage of the natural physics of fluid dynamics, allowing the warm fluid to rise and be siphoned off for cooling from the top. Because the manifolds 1402 are separate from the tanks 104, the blade 106 designs and their corresponding optimal manifold designs can both be changed within the context of the self-enclosed mobile high performance computing platform 100. Changing manifold design in a modular way saves significant labor, time, and cost by not having to rebuild and replace the entire tank 104.

Interface Board Embodiments

Figure 19:
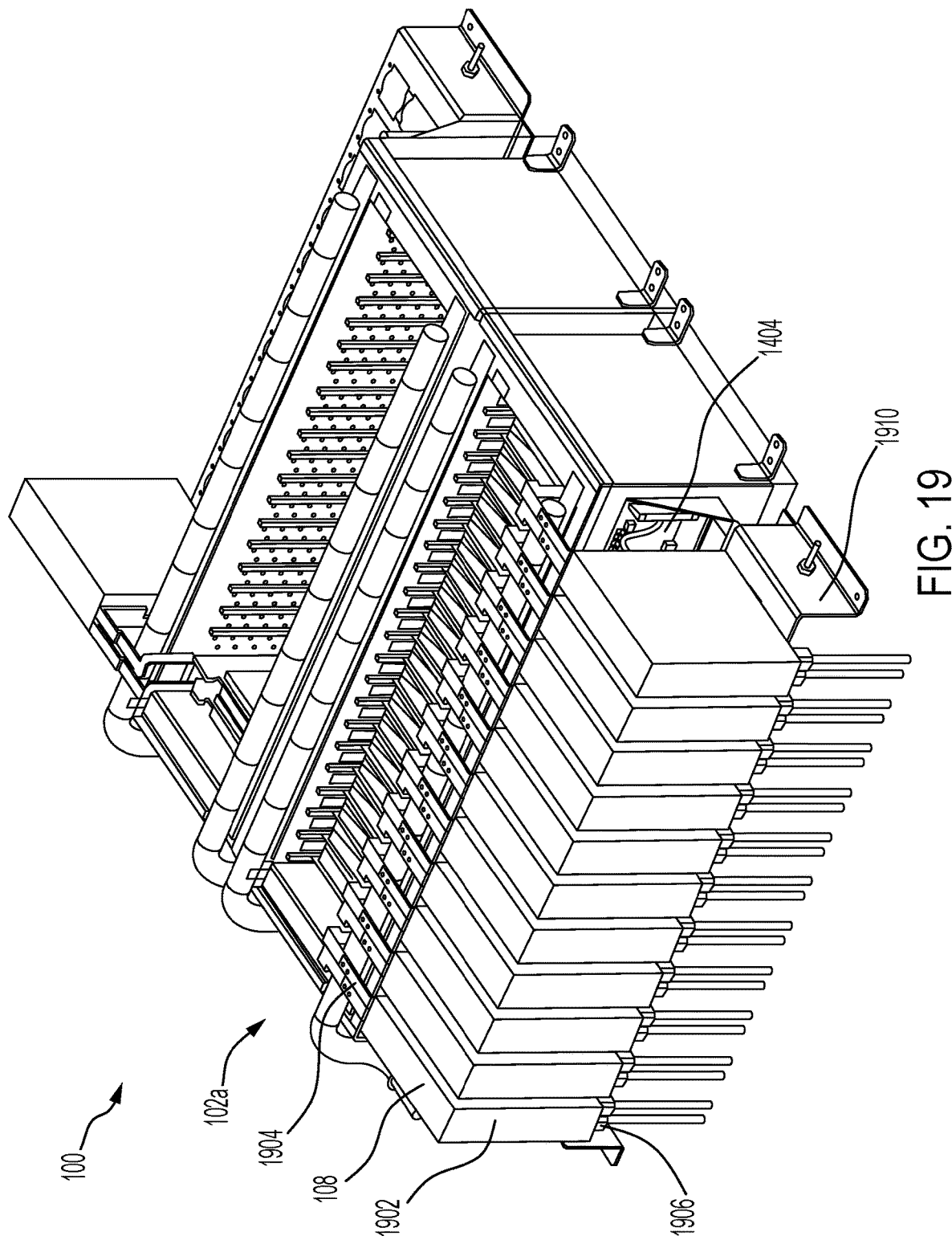
FIGS. 19 to 21 are diagrams of an immersion cooled computing apparatus with twenty-two computing blades and twenty-two corresponding interface boards, according to an example embodiment of the present disclosure.

Each computing apparatus 102 includes one or more interface boards 108 for communicatively and electrically coupling to one or more computing blades 106. FIG. 19 is a diagram of a computing apparatus 102 with twenty-two computing blades 106 and twenty-two corresponding interface boards 108, according to an example embodiment of the present disclosure. Pairs of interface boards 108 are enclosed within an interface housing 1902. A bracket assembly 1904 mechanically connects the interface housing 1902 to the computing blades 106.

Figure 20:
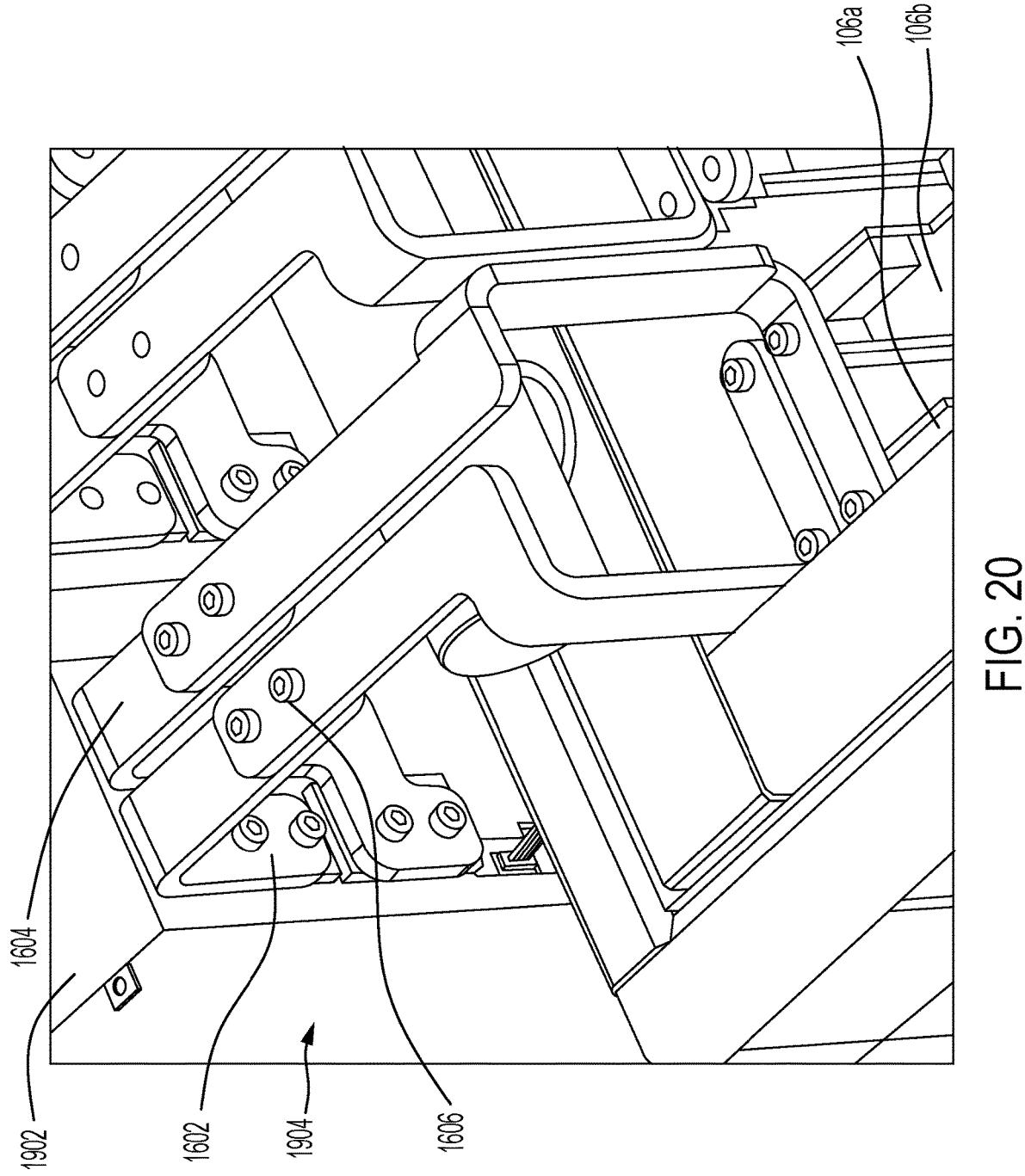

FIG. 20 is a diagram of the bracket assembly 1904, according to an example embodiment of the present disclosure. The bracket assembly 1904 includes a first bracket 1602 that connects to the interface housing 1902 and one of the computing blades 106a. The bracket assembly 1904 also includes a second bracket 1604 that connects the interface housing 1902 to another one of the computing blades 106b. The brackets 1602 and 1604 are configured to retain the computing blades 106a and 106b within the tank 104. Each of the brackets 1602 and 1604 includes connectors 1606 that enable ends of the brackets to be removed. This enables the brackets 1602 and 1604 to be lifted upwards after the connectors are removed, thereby removing the computing blades 106*a* and 106*b* from the tank 104. Since each computing blade 106 is connected to a separate bracket, each computing blade may be individually removed from the immersion tank 104.

Returning to FIG. 19, each interface board 108 is configured to receive an individual electrical connection 1906 from the power circuit board 902 of FIG. 9. As such, each interface board 108 is configured to convert, for example, an AC voltage into one or more DC voltages for the computing blades 106. Each interface board 108 is also configured to receive a wired communication connection from the control processor 114. Such a configuration enables each of the interface boards 108 to be individually addressed so that the control processor 114 can communicate individually with each computing blade 106.

As shown in FIG. 19, the interface boards 108, via the interface housing 1902, are connected to a support structure 1910, which is adjacent to the tank 104. In some embodiments, the support structure 1910 is connected to the tank 104. Further, the interface boards 108 are connected to the computing blades 106 via electrical and communication connectors, which may be located along a side of the tank 104 or at a bottom of the tank 104. FIGS. 14 and 19 show electrical and communication connectors 1404 positioned along a side of the tank 104. The connectors 1404 may pass through the side of the tank 104 (via a fluidly sealed coupling) to enable connection to the computing blades 106. In other embodiments, the connectors 1404 may be located at a bottom of the tank 104.

Figure 21:
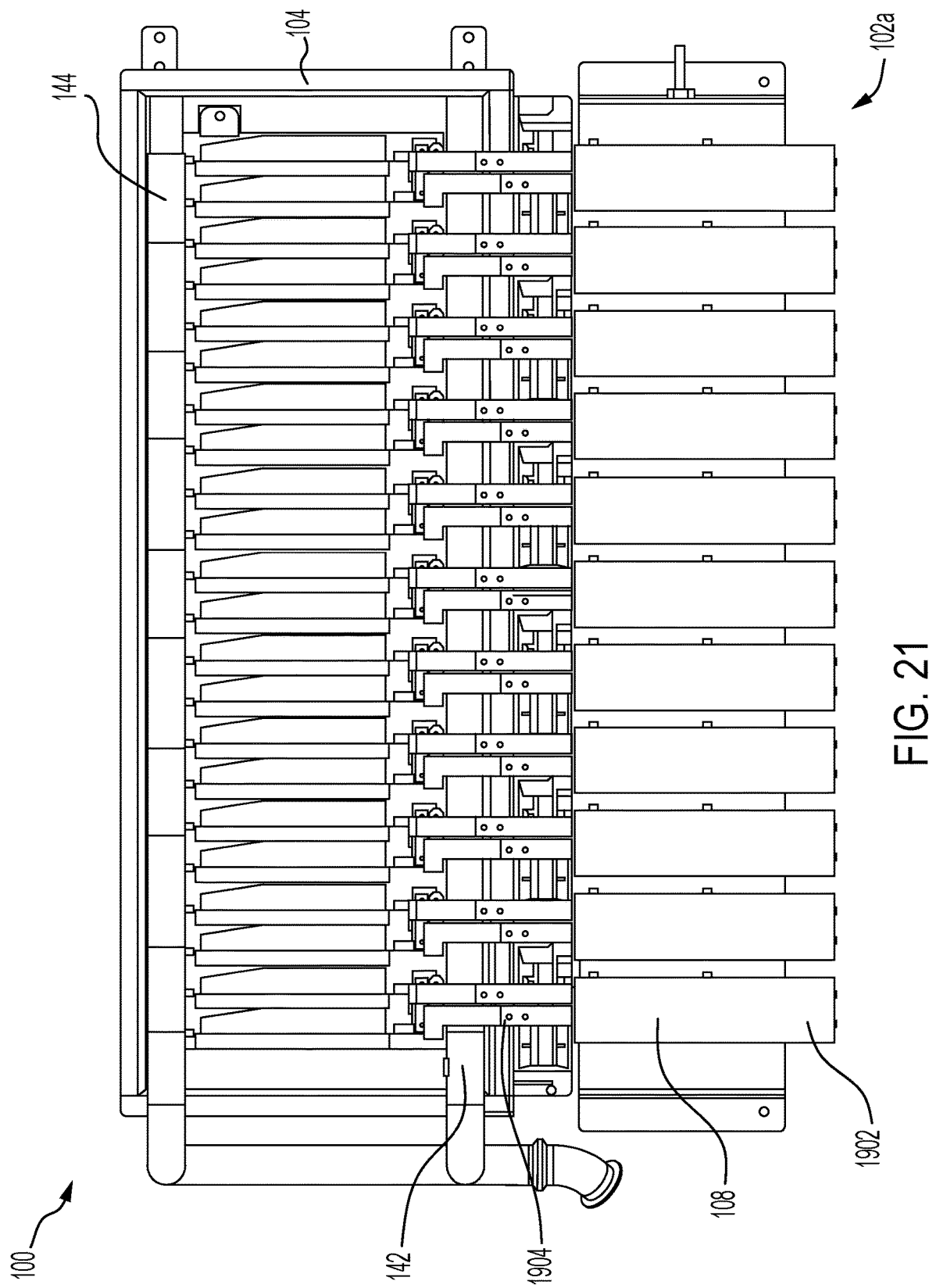
Figure 22:
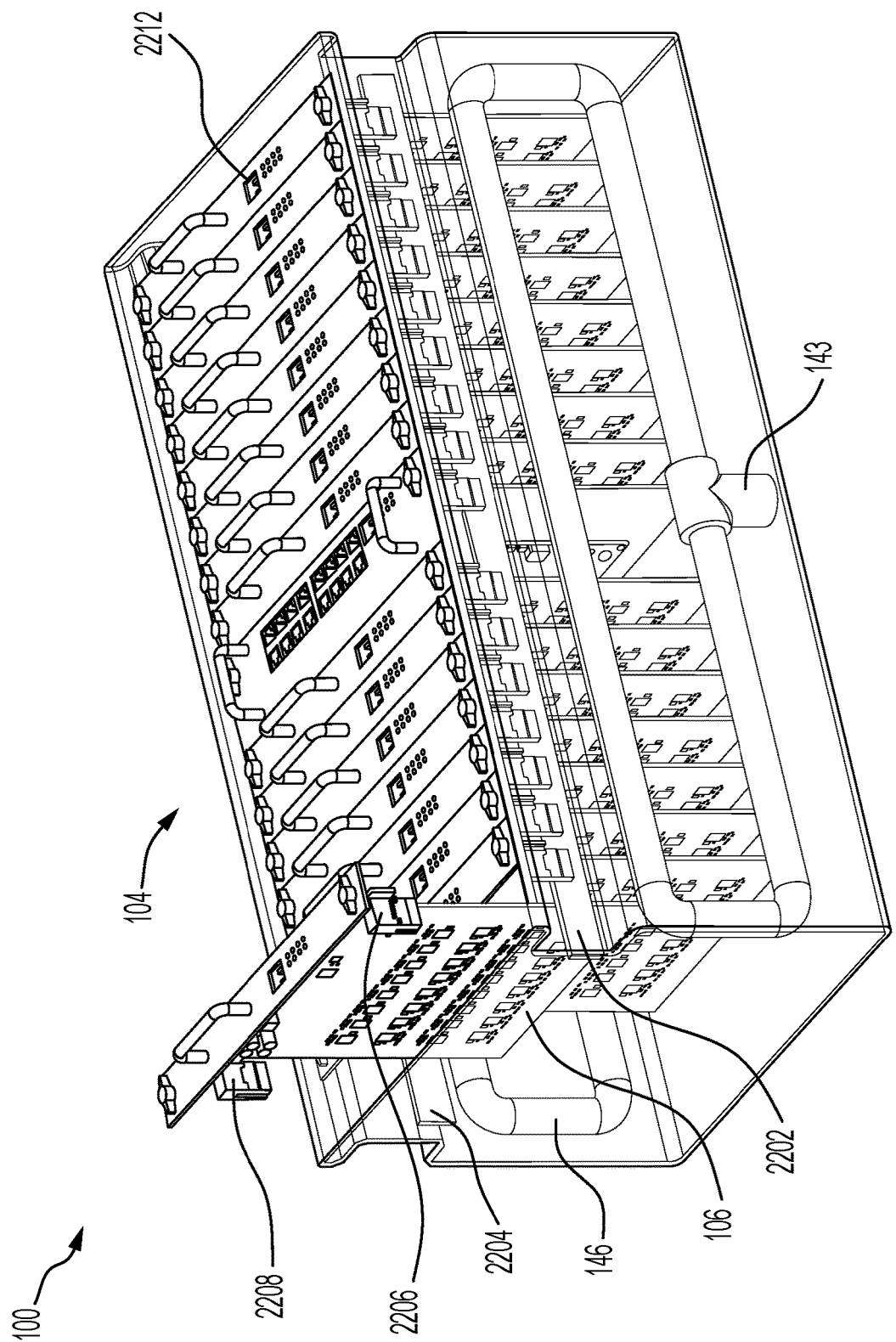
FIGS. 22 to 25 are diagrams of an additional embodiment of the mobile high performance computing platform of FIG. 1, according to an example embodiment of the present disclosure.
Figure 23:
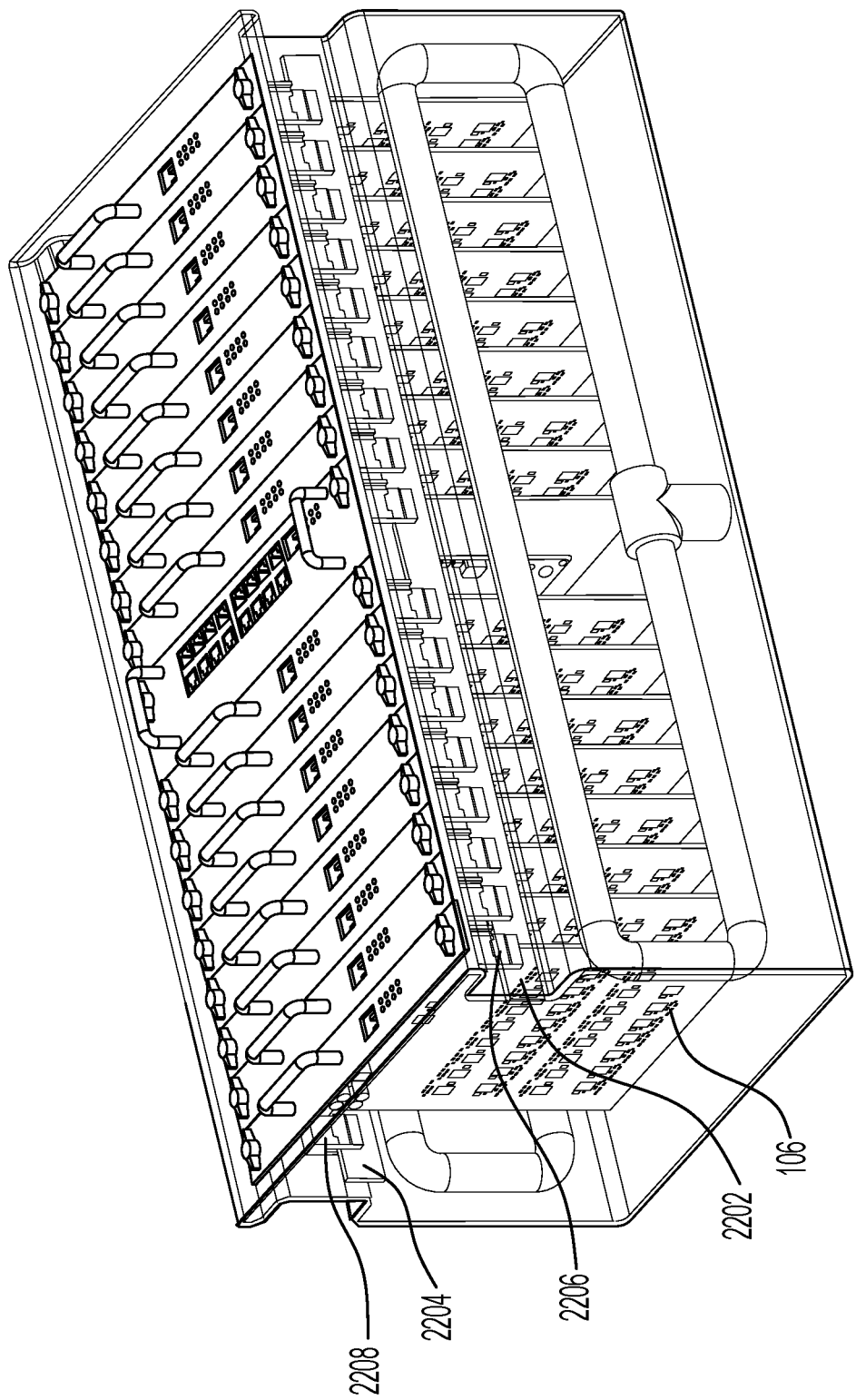

FIG. 21 shows a plan view of the tank 104 and the interface housings 1902 of the computing apparatus 102, according to an example embodiment of the present disclosure. As shown, twenty-two computing blades 106 are closely aligned within a relatively small tank 104. Each of the computing blades 106 has a separate interface board 108 for communication and electrical coupling. The interface boards 108 and the interface housing 1902 are secured in place since they are not typically removed. Only the computing blades 106 may experience periodic failure and need replacement. As such, the computing apparatus 102 separates the functionality into different boards 106 and 108 such that the computing blades 106, which are most likely to fail, are easily replaced without having to disconnect the respective interface boards 108 or other computing blades 106. Such a configuration enables the computing blades 106 to be provided at a lower cost since the power and communication circuitry 112 is separately located at the interface boards 108.

While reference is made herein to using the immersion tank 104 within the mobile high performance computing platform 100, it should be appreciated that the tank 104 and corresponding fluid loops FL1 and FL2 may be used in other applications. For example, the immersion tank 104 and the fluid loops FL1 and FL2 may be included within a data center or a super computer. In other examples, the immersion tank 104 and the fluid loops FL1 and FL2 may be used in a cloud computing environment.

Additional Tank Embodiment

FIGS. 22 to 25 are diagrams of an additional embodiment of the tank 104, according to an example embodiment of the present disclosure. In this embodiment, electricity is distributed to the entire tank via two metal bus bars 2202 and 2204, one on each side of the tank 104. The first bus bar 2202 receives a voltage, such as 5 volts or 12 volts. The second bus bar 2204 is electrically coupled to a ground. In other embodiments, the voltage is applied to bus bar 2204 and the bus bar 2202 is connected to ground.

Each computing blade 106 includes clips 2206 and 2208, which respectively connect to the bus bars 2202 and 2204. The clips 2206 and 2208 are configured to hold the computing blades 106 in place while suspending the computing blades within the tank 104. In this embodiment, each of the computing blades 106 includes circuits of the respective interface board 108. As such, the computing blade 106 includes a face panel 2212 for communicative coupling to, for example, an Ethernet or a USB cable. The face panel 2212 may also provide visual indication of different states of the respective panel. For example, the panel 2212 may include a light showing successful power and operation, a light for location of certain computing blades 106 for diagnosis or maintenance, a light indicating successful communication to the control processor 114.

Figure 24:
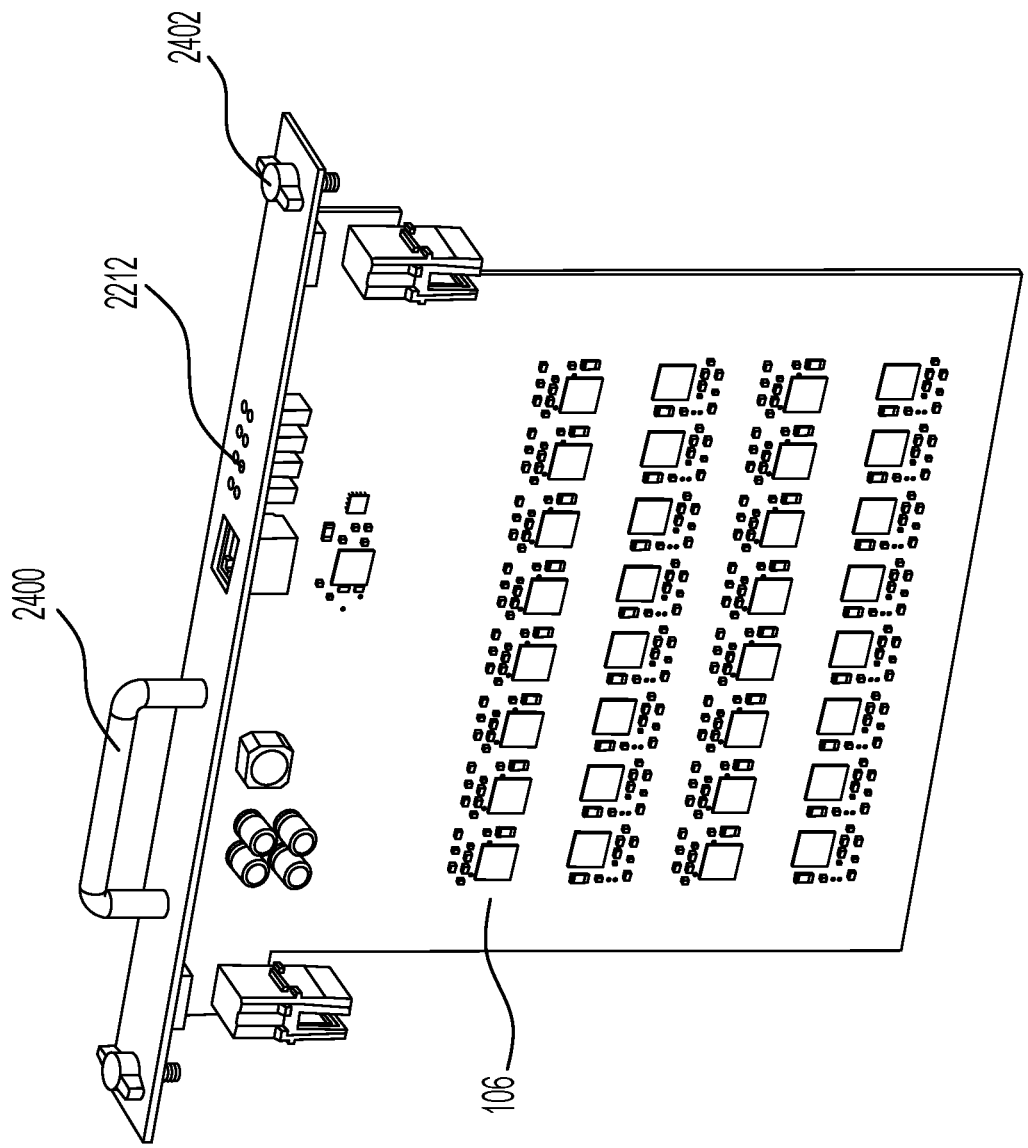
Figure 25:
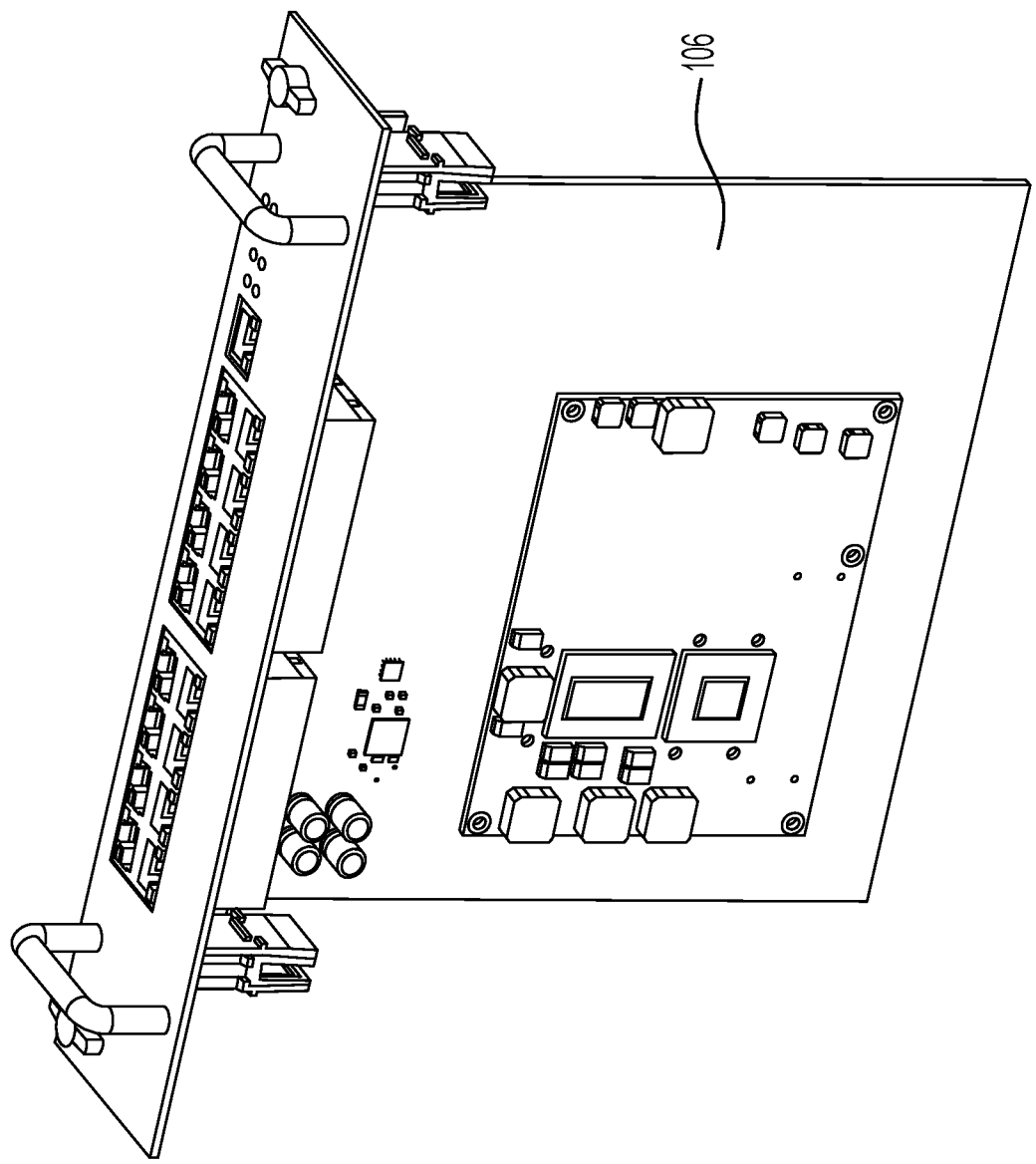

Also as shown in FIG. 24, each panel 2212 includes a handle 2400 that enables the panel to be removed from the tank 104 by an operator. The panel 2212 may further include connectors 2402 for securely connecting the panel 2212 to a housing of the tank 104 after the clips 2206 and 2208 are connected to the bus bars 2202 and 2204. FIG. 25 shows another embodiment of the panel 2212 with two handles and vents to enable air to pass through to the computing blade 106 and dielectric fluid within the tank 104.

Returning to FIG. 22, the tank 104 includes an outlet port 143 that is provided in the shape of a loop, which includes a plurality of spaced-apart apertures. The inlet port 146 may also include a similar loop. The loop configuration enables dielectric fluid to be routed along an entire length of the tank 104. This configuration enables a constant stream of lower temperature dielectric fluid to flow across the face of each computing blade to rapidly dissipate heat. In some embodiments, the manifold 1402 discussed in connection with FIG. 14 may be used.

CONCLUSION

It will be appreciated that all of the disclosed methods and procedures described herein can be implemented using one or more computer programs or components. These components may be provided as a series of computer instructions on any conventional computer-readable medium, including RAM, ROM, flash memory, magnetic or optical disks, optical memory, or other storage media. The instructions may be configured to be executed by a processor, which when executing the series of computer instructions performs or facilitates the performance of all or part of the disclosed methods and procedures.

It should be understood that various changes and modifications to the example embodiments described herein will be apparent to those skilled in the art. Such changes and modifications can be made without departing from the spirit and scope of the present subject matter and without diminishing its intended advantages. It is therefore intended that such changes and modifications be covered by the appended claims.

It should be appreciated that 35 U.S.C. 112(f) or pre-AIA 35 U.S.C 112, paragraph 6 is not intended to be invoked unless the terms "means" or "step" are explicitly recited in the claims. Accordingly, the claims are not meant to be limited to the corresponding structure, material, or actions described in the specification or equivalents thereof.

The invention is claimed as follows:

1. A mobile computing apparatus comprising:
   a tank configured to hold a dielectric fluid, the tank including an inlet port to receive the dielectric fluid and an outlet port from which the dielectric fluid is pulled;
   a plurality of connectors located within the tank, each of the connectors configured to receive a respective one of computing blades that is immersed within the dielectric fluid and configured for mining cryptocurrency coins or performing other high performance computing applications, each of the connectors electrically and communicatively coupled to a corresponding interface board that is located outside of the tank;
   at least one fluid-to-fluid heat exchanger configured to cool the dielectric fluid;
   a dielectric closed cooling loop including:
      a from-tank line having a first end connected to the outlet port of the tank and a second end connected to a first input end of the at least one fluid-to-fluid heat exchanger;
      a dielectric fluid pump fluidly coupled to a first outlet end of the at least one fluid-to-fluid heat exchanger, the dielectric fluid pump configured to pump the dielectric fluid from the at least one fluid-to-fluid heat exchanger to the tank via a to-tank line; and
      a manifold fluidly coupled between the inlet port and an interior of the tank, the manifold including a plurality of openings through which the dielectric fluid is pushed toward the outlet port;
   a source of a cooling fluid;
   a from-source line having a first end connected to the source of the cooling fluid and a second end connected to a second input end of the at least one fluid-to-fluid heat exchanger; and
   a cooling fluid pump fluidly coupled to a second outlet end of the at least one fluid-to-fluid heat exchanger, the cooling fluid pump configured to pump the cooling fluid from the at least one fluid-to-fluid heat exchanger to the source of the cooling fluid via a to-source line,
   wherein the tank, the at least one fluid-to-fluid heat exchanger, the dielectric cooling loop, and the cooling fluid pump are located entirely within a cabinet.

2. The apparatus of claim 1, wherein the at least one fluid-to-fluid heat exchanger includes two fluid-to-fluid heat exchangers and the second end of the from-tank line branches to each of the first input ends of the two fluid-to-fluid heat exchangers, and
   wherein the first outlet end of each of the fluid-to-fluid heat exchangers is fluidly coupled to a single input line of the from-tank line that is fluidly connected to the dielectric fluid pump.

3. The apparatus of claim 2, wherein the second end of the from-source line branches to each of the second input ends of the two fluid-to-fluid heat exchangers, and
   wherein the second outlet end of each of the fluid-to-fluid heat exchangers is fluidly coupled to a single input line of the from-source line that is fluidly connected to the cooling fluid pump.

4. The apparatus of claim 1, wherein the plurality of openings of the manifold include circular apertures or parallel slots.

5. The apparatus of claim 4, wherein the plurality of openings are the circular apertures, the circular apertures have varying diameters between 0.1 millimeters and 2 centimeters.

6. The apparatus of claim 1, wherein the manifold is located on a side of the tank, and
   wherein the outlet port includes a plurality of outlet ports that are located on an opposite side of the tank across from the manifold.

7. The apparatus of claim 1, wherein the manifold is located on a bottom of the tank, and
   wherein the outlet port includes a plurality of outlet ports that are located on a top of the tank across from the manifold.

8. The apparatus of claim 1, wherein each connector is located at a bottom of the tank or along a side of the tank.

9. The apparatus of claim 1, wherein each corresponding interface board includes:
   power circuitry configured to convert an AC voltage into one or more DC voltages for the respective one of the computing blades; and
   communication circuitry for communicatively coupling the respective one of the computing blades to a control processor.

10. The apparatus of claim 1, further comprising:
    a plurality of interface board housings, each of the interface board housings located adjacent to the tank and configured to enclose at least one of the corresponding interface board; and
    for each of the interface board housings, at least one bracket having a first end connected to a respective one of the interface board housings and a second end connected to the respective one of the computing blades to retain in place the respective one of the computing blades.

11. The apparatus of claim 1, wherein the source of the cooling fluid includes a cooling fluid tower.

12. The apparatus of claim 1, further comprising:
    an air heat exchanger aligned with the source of cooling fluid; and
    at least one blower configured to flow air across the air heat exchanger.

13. The apparatus of claim 1, further comprising:
    at least one temperature sensor configured to be immersed within the dielectric fluid within the tank; and
    a control processor communicatively coupled to the at least one temperature sensor, the dielectric fluid pump, and the cooling fluid pump, the control processor configured to:
       receive temperature data from the at least one temperature sensor, and
       control a pumping speed of at least one of the dielectric fluid pump or the cooling fluid pump to maintain a specified temperature of the dielectric fluid.

14. The apparatus of claim 13, wherein the at least one temperature sensor is coupled to the tank.

15. The apparatus of claim 13, wherein the at least one temperature sensor is located on at least one of the computing blades.

16. The apparatus of claim 13, wherein the specified temperature of the dielectric fluid is a first specified temperature of the dielectric fluid that corresponds to a temperature selected to conserve energy or a second specified temperature of the dielectric fluid that corresponds to a temperature selected to maximize computing power of the computing blades.

17. The apparatus of claim 16, wherein the control processor is configured to receive a selection of the first or second specified temperature of the dielectric fluid or select the first or second specified temperature of the dielectric fluid based on detected computing operations of the computing blades.

18. A mobile computing system comprising:
a cabinet including
at least one air intake located along a rear panel;
an air exhaust located along a top panel; and
at least one door located along a front panel; and
at least one mobile computing apparatus located within the cabinet, each of the at least one mobile computing apparatus including:
   a tank configured to hold a dielectric fluid, the tank including an inlet port to receive the dielectric fluid and an outlet port from which the dielectric fluid is pulled,
   a plurality of connectors located within the tank, each of the connectors configured to receive a computing blade that is immersed within the dielectric fluid and configured for mining cryptocurrency coins or performing other high performance computing applications, each of the connectors electrically and communicatively coupled to an interface board that is located outside of the tank,
   at least one fluid-to-fluid heat exchanger configured to cool the dielectric fluid,
   a dielectric closed cooling loop including:
      a from-tank line having a first end connected to the outlet port of the tank and a second end connected to a first input end of the at least one fluid-to-fluid heat exchanger,
      a dielectric fluid pump fluidly coupled to a first outlet end of the at least one fluid-to-fluid heat exchanger, the dielectric fluid pump configured to pump the dielectric fluid from the at least one fluid-to-fluid heat exchanger to the tank via a to-tank line, and
      a manifold fluidly coupled between the inlet port and an interior of the tank, the manifold including a plurality of openings through which the dielectric fluid is pushed toward the outlet port,
   a source of a cooling fluid,
   a from-source line having a first end connected to the source of the cooling fluid and a second end connected to a second input end of the at least one fluid-to-fluid heat exchanger, and
   a cooling fluid pump fluidly coupled to a second outlet end of the at least one fluid-to-fluid heat exchanger, the cooling fluid pump configured to pump the cooling fluid from the at least one fluid-to-fluid heat exchanger to the source of the cooling fluid via a to-source line,
   wherein the tank, the at least one fluid-to-fluid heat exchanger, the dielectric cooling loop, and the cooling fluid pump are located entirely within the cabinet.

19. The system of claim 18, wherein at least one mobile computing apparatus is four mobile computing apparatuses, the cabinet is configured to enclose the four mobile computing apparatuses, two of the four mobile computing apparatuses located on a top shelf and another two of the four mobile computing apparatuses located on a bottom shelf.

20. The system of claim 19, wherein the at least one air intake includes a top air intake and a bottom air intake, the cabinet includes the top air intake aligned with the top shelf and the bottom air intake aligned with the bottom shelf.

21. The system of claim 18, wherein each mobile computing apparatus includes:
   at least one temperature sensor configured to be immersed within the dielectric fluid within the respective tank; and
   a control processor communicatively coupled to the at least one temperature sensor, the dielectric fluid pump, and the cooling fluid pump, the control processor configured to:
      receive temperature data from the at least one temperature sensor, and
      control a pumping speed of at least one of the dielectric fluid pump or the cooling fluid pump to maintain a specified temperature of the dielectric fluid.

22. The system of claim 18, further comprising a control processor communicatively coupled to each of the at least one mobile computing apparatuses for control of a pumping speed of at least one of the dielectric fluid pump or the cooling fluid pump of each of the at least one mobile computing apparatus to maintain a specified temperature of the dielectric fluid.

* * * * *